United States Patent
Nakamura et al.

(10) Patent No.: US 10,932,372 B2
(45) Date of Patent: Feb. 23, 2021

(54) FLUID DISCHARGE DEVICE

(71) Applicant: SENJU METAL INDUSTRY CO., LTD., Tokyo (JP)

(72) Inventors: Hideki Nakamura, Tokyo (JP); Takashi Nauchi, Tokyo (JP); Toshihiko Mutsuji, Tokyo (JP); Ryoichi Suzuki, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 224 days.

(21) Appl. No.: 16/063,155

(22) PCT Filed: Dec. 15, 2016

(86) PCT No.: PCT/JP2016/087369
§ 371 (c)(1),
(2) Date: Jun. 15, 2018

(87) PCT Pub. No.: WO2017/104745
PCT Pub. Date: Jun. 22, 2017

(65) Prior Publication Data
US 2018/0376600 A1  Dec. 27, 2018

(30) Foreign Application Priority Data

Dec. 15, 2015 (JP) .................................. 2015-244139
Dec. 15, 2015 (JP) .................................. 2015-244141
Aug. 26, 2016 (JP) ............................. JP2016-165458

(51) Int. Cl.
*H05K 3/34* (2006.01)
*H01L 23/00* (2006.01)
(Continued)

(52) U.S. Cl.
CPC ............. *H05K 3/3468* (2013.01); *B05C 5/02* (2013.01); *B05C 11/10* (2013.01); *B05C 21/00* (2013.01);
(Continued)

(58) Field of Classification Search
USPC ..................................... 118/50, 72, 313, 429
See application file for complete search history.

(56) References Cited

U.S. PATENT DOCUMENTS 4,517,917 A * 5/1985 Santefort ................. B05C 5/02
118/300
4,898,117 A   2/1990 Ledermann et al.
(Continued)

FOREIGN PATENT DOCUMENTS

EP   2724787   * 4/2014
EP   3246097   * 11/2017
(Continued)

OTHER PUBLICATIONS

Extended European Search Report in corresponding European Patent Application No. 16875722.7, dated Jul. 9, 2019.
(Continued)

*Primary Examiner* — Brian K Talbot
(74) *Attorney, Agent, or Firm* — Harness, Dickey & Pierce, P.L.C.

(57) ABSTRACT

In conventional fluid discharge devices, a discharge head used should be increased in size according to increase in size of a workpiece such as silicon wafer. However, if the discharge head increases in length, a deformation amount of a mask used for discharging the fluid on the workpiece increases, thereby the discharging amount varies. Discharging the fluid in a reciprocating manner is performed using a fluid discharging device including a head unit having a width shorter than a length of the workpiece. A suction port having
(Continued)

opening portions each having a slit shape are disposed on the both sides of the discharge nozzle in a vicinity of the discharge nozzle.

10 Claims, 16 Drawing Sheets

(51) Int. Cl.

| | |
|---|---|
| B05D 3/12 | (2006.01) |
| H05K 3/28 | (2006.01) |
| B05C 11/10 | (2006.01) |
| B05D 1/26 | (2006.01) |
| B23K 3/06 | (2006.01) |
| B05C 5/02 | (2006.01) |
| B05C 21/00 | (2006.01) |
| B05D 7/00 | (2006.01) |
| B23K 1/20 | (2006.01) |
| H05K 3/10 | (2006.01) |
| B23K 1/00 | (2006.01) |
| H05K 3/14 | (2006.01) |
| B23K 101/42 | (2006.01) |
| B23K 101/40 | (2006.01) |

(52) U.S. Cl.
CPC ............ *B05D 1/26* (2013.01); *B05D 3/12* (2013.01); *B05D 7/00* (2013.01); *B23K 1/0016* (2013.01); *B23K 1/20* (2013.01); *B23K 3/06* (2013.01); *B23K 3/0623* (2013.01); *B23K 3/0638* (2013.01); *H01L 24/11* (2013.01); *H01L 24/742* (2013.01); *H05K 3/10* (2013.01); *H05K 3/143* (2013.01); *H05K 3/28* (2013.01); *H05K 3/34* (2013.01); *B23K 2101/40* (2018.08); *B23K 2101/42* (2018.08); *H01L 24/13* (2013.01); *H01L 2224/11312* (2013.01); *H01L 2224/131* (2013.01)

(56) References Cited

U.S. PATENT DOCUMENTS

| | | | | |
|---|---|---|---|---|
| 4,934,309 | A | | 6/1990 | Ledermann et al. |
| 5,418,009 | A | * | 5/1995 | Raterman ............ B05C 5/0254 118/324 |
| 5,478,700 | A | * | 12/1995 | Gaynes ................ H01L 24/83 430/315 |
| 5,545,465 | A | | 8/1996 | Gaynes et al. |
| 5,565,033 | A | | 10/1996 | Gaynes et al. |
| 6,149,076 | A | * | 11/2000 | Riney ................ B05B 7/0861 239/135 |
| 6,231,333 | B1 | * | 5/2001 | Gruber ................ B23K 3/0607 118/256 |
| 6,461,136 | B1 | * | 10/2002 | Gruber ................ H01L 21/486 118/213 |
| 6,544,590 | B1 | | 4/2003 | Kodera et al. |
| 6,743,478 | B1 | * | 6/2004 | Kiiha .................. D21H 23/48 427/294 |
| 6,783,797 | B2 | * | 8/2004 | Bourrieres ............ B05C 3/18 118/415 |
| 8,128,995 | B2 | * | 3/2012 | Park .................... B05C 5/0254 427/348 |
| 8,191,498 | B2 | * | 6/2012 | Hein ................... H05K 3/4053 118/57 |
| 8,287,647 | B2 | * | 10/2012 | Yoon .................. C23C 16/45551 118/715 |
| 2002/0121341 | A1 | | 9/2002 | Tanaka et al. |
| 2004/0202863 | A1 | * | 10/2004 | Saito .................... B41J 2/14 428/411.1 |
| 2005/0242062 | A1 | | 11/2005 | Sakurai et al. |
| 2013/0189434 | A1 | * | 7/2013 | Randall .............. B05C 5/0216 427/256 |
| 2014/0115874 | A1 | | 5/2014 | Narita et al. |
| 2014/0224860 | A1 | * | 8/2014 | Biggs .................. B23K 3/0607 228/33 |
| 2015/0007958 | A1 | | 1/2015 | Sato et al. |
| 2018/0021803 | A1 | * | 1/2018 | Nauchi ................ B05D 1/26 427/58 |
| 2019/0132960 | A1 | * | 5/2019 | Nakamura .......... B23K 3/0623 |

FOREIGN PATENT DOCUMENTS

| | | |
|---|---|---|
| JP | S55-154798 A | 12/1980 |
| JP | H02-015698 A | 1/1990 |
| JP | H06-151296 A | 5/1994 |
| JP | H07-202399 A | 8/1995 |
| JP | 2001-269610 A | 10/2001 |
| JP | 2002-260985 A | 9/2002 |
| JP | 2003-249440 A | 9/2003 |
| JP | 2004-122021 A | 4/2004 |
| JP | 2004-223339 A | 8/2004 |
| JP | 2004/305791 A | 11/2004 |
| JP | 2004-337704 A | 12/2004 |
| JP | 2005-183542 A | 7/2005 |
| JP | 2005/246139 A | 9/2005 |
| JP | 2006-013228 A | 1/2006 |
| JP | 2006-080403 A | 3/2006 |
| JP | 2012-139655 A | 7/2012 |
| JP | 2014091222 A | 5/2014 |
| JP | 2014-157863 A | 8/2014 |
| JP | 2015-054269 A | 3/2015 |
| WO | WO-2013058299 A1 | 4/2013 |
| WO | WO-2016114275 A1 | 7/2016 |

OTHER PUBLICATIONS

International Preliminary Report on Patentability dated Jun. 21, 2018 in corresponding International Patent Application No. PCT/JP2016/087369, with English translation.

International Search Report (in English and Japanese) of the International Searching Authority issued in PCT/JP2016/087369, dated Mar. 21, 2017; ISA/JPO.

* cited by examiner

FLUID DISCHARGE DEVICE

CROSS REFERENCE TO RELATED APPLICATIONS

This application is a U.S. National Phase Application under 35 U.S.C. 371 of International Application No. PCT/JP2016/087369 filed on Dec. 15, 2016 and published in Japanese as WO 2017/104745 A1 on Jun. 22, 2017, which is based on and claims the benefit of priority from Japanese Patent Application No. 2016-165458, filed Aug. 26, 2016 and Japanese Patent Application Nos. 2015-244139 and 2015-244141, both filed on Dec. 15, 2015. The entire disclosures of all of the above applications are incorporated herein by reference.

TECHNICAL FIELD

The present invention relates to a device which discharges fluid such as molten solder or an adhesive agent on a substrate or a workpiece of an electronic component such as a semiconductor.

BACKGROUND ART

To mount an electronic component, such as a semiconductor, on a printed circuit board of electronic equipment or to assemble an electronic component, such as a semiconductor, solder or an adhesive agent is used. Particularly, soldering cannot be performed on an electronic component made of ceramic or the like without performing any treatment. In view of the above, pads formed of a plating film are formed on a surface of an electronic component workpiece, and solder bumps (humps) are formed on the pads. Thereafter, soldering is performed using the bumps.

Conventionally, a method which uses a solder paste is used as a method for forming solder bumps in many cases. A solder paste is applied on a plating film of a workpiece by a printer or a dispenser and, thereafter, the solder paste is subjected to reflow heating so as to melt the solder paste to form bumps. This method enables low cost. However, there is a lower limit to applying a solder paste by printing and hence, bumps which correspond to a fine circuit pattern cannot be formed.

There is also a method for forming a bump by making use of a solder ball. Fine solder balls are mounted on an electronic component workpiece, and the solder balls are subjected to reflow heating, thus forming bumps. With the use of such a method, bumps which correspond to a fine circuit pattern can be formed. However, cost for solder balls per se is high so that cost increases as a whole.

As a method for forming bumps which can manage a fine circuit pattern at low cost, a so-called molten solder method has been attracting attention where molten solder is discharged so as to form solder bumps. For example, a solder deposition device disclosed in PTL 1 described below is known as a device for realizing the molten solder method. In this solder deposition device, a nozzle opening portion of a vessel which stores molten solder is caused to scan in the horizontal direction, thus efficiently suppling molten solder to a plurality of portions. A bump forming device is also known which includes a mechanism for lifting a nozzle head from a mask after the operation is finished and the nozzle head is cooled (for example, PTL 2 described below).

CITATION LIST

Patent Literature

PTL 1: Japanese Patent Application Laid-Open No. H2-015698
PTL 2: WO2013/058299A

SUMMARY OF INVENTION

Technical Problem

In a solder bump forming device which makes use of molten solder or in a fluid discharge device such as an adhesive agent application device, in general, as shown in FIG. 1, the size of a discharge head is equal to the size of a workpiece such as a silicon wafer or a printed circuit board. The discharge head moves in a fixed direction. With such a configuration, it is possible to prevent a deflection of a mask which is caused by moving a squeegee while the number of scanning operations is small.

When a silicon wafer, a printed circuit board or the like has a small size, such a device causes no problems. However, when such a device is used for a workpiece of a large size such as a silicon wafer of 300 mm, it is necessary to increase the length of the discharge head to correspond to the size of the workpiece. When the length of the discharge head increases, a pressure applied to the workpiece from the discharge head is not always uniformly distributed, and the pressure varies. Accordingly, a mask is deformed due to deflection generated by a stroke and hence, a uniform amount of fluid cannot be discharged from the discharge head. Further, assuming that fluid is discharged using a small head a plurality of times, when a discharge pattern is a fine pattern, the distance between adjacent discharge portions is small and hence, the fluid is discharged in an overlapping manner. For this reason, the amount of discharge is unstable.

In view of the above, there has been a demand for provision of a fluid application device which can apply fluid at a stable amount of discharge even when fluid is discharged to a workpiece of a large size such as a silicon wafer of 300 mm. Further, it is desirable that fluid can be applied to a region of a workpiece as widely as possible.

Solution to Problem

The present invention has been made to overcome at least a portion of the above-mentioned problem, and can be realized as the following aspects, for example.

According to a first aspect of the present invention, there is provided a method for discharging fluid for applying the fluid into a mask on an electronic component workpiece. The method uses a fluid discharge device including a head unit which includes: a tank capable of storing the fluid; and a discharge head. The head unit has a width shorter than a length of the workpiece. The discharge head has a suction port formed for sucking a substance in the mask on the workpiece, and a discharge nozzle formed in a vicinity of the suction port for discharging the fluid. The suction port is provided on a forward side of the discharge head in a traveling direction. The fluid is discharged using the fluid discharge device such that the discharge head reciprocates with respect to the workpiece.

According to the first aspect, the discharge head is reciprocated with respect to a workpiece as shown in FIG. 2 and hence, the deformation of the mask can be reduced. To be more specific, the deformation of the mask is generated when the discharge head moves in the first direction. However, the discharge head is moved again in the second direction which is the direction opposite to the first direction and hence, the mask which is deformed once returns to an original state. Accordingly, the deformation of the mask can be reduced.

According to a second aspect of the present invention, there is provided a fluid discharge device for applying fluid into a mask on an electronic component workpiece. The fluid discharge device includes a head unit which includes a tank capable of storing the fluid, and a discharge head. The head unit has a width shorter than a length of the workpiece. The discharge head has a suction port formed in a vicinity of a discharge nozzle for discharging the fluid, and having an opening portion having a slit shape for sucking a substance in the mask on the workpiece. The suction port is disposed on both sides of the discharge nozzle.

According to the second aspect, the fluid is discharged while reciprocating the discharge head and hence, the deformation of the mask is not biased in one direction so that the deformation of the mask is reduced. Accordingly, the amount of discharge does not vary and hence, the fluid of a stable amount of discharge can be discharged. Therefore, it is possible to eliminate a large amount of correction which is conventionally required on applying the fluid into a fine mask for a workpiece and hence, productivity can be remarkably enhanced.

According to a third aspect of the present invention, there is provided a fluid discharge device for applying fluid into a mask on an electronic component workpiece. The fluid discharge device includes a plurality of head units each of which includes a tank capable of storing the fluid and a discharge head. Each head unit has a smaller size than the workpiece. The head units move in a horizontal direction above the workpiece in synchronism with each other. Each discharge head has a suction port formed for sucking a substance in the mask on the workpiece, and a discharge nozzle formed in a vicinity of the suction port for discharging the fluid. The suction port is provided on a forward side of the discharge head in a traveling direction. The suction port degasses and decompresses air in the mask on the workpiece before the fluid is discharged, so that a uniform amount of fluid can be stably discharged.

According to a fourth aspect of the present invention, there is provided a method for discharging fluid for applying the fluid into a mask on an electronic component workpiece. The method for discharging the fluid includes a plurality of head units each of which includes a tank capable of storing the fluid and a discharge head. Each head unit has a smaller size than the workpiece, and an angle of each head unit is changeable. The head units move in a horizontal direction above the workpiece in synchronism with each other. Each discharge head has a suction port formed for sucking a substance in the mask on the workpiece, and a discharge nozzle formed in a vicinity of the suction port for discharging the fluid. The suction port is provided on a forward side of the discharge head in a traveling direction. The suction port degasses and decompresses air in the mask on the workpiece before the fluid is discharged, so that a uniform amount of fluid can be stably discharged.

Split head units may have a size which allows a pressure in the vertical direction applied by the head units to be uniform. To be more specific, it is preferable that the size of each head unit be set to ½ to ¼ of the lateral length of a workpiece. Further, the number of the plurality of head units used in this application may be determined corresponding to the size of a workpiece. The number of head units is appropriately set to 2 to 4 in view of ease of handling. When the fluid is discharged to a workpiece having a circular shape such as a silicon wafer, it is optimal to use three head units. As in the case shown in FIG. 6, in the discharge of the fluid to a workpiece having a circular shape, the head units are horizontally moved in a forward and rearward direction, and angles of the head units disposed on the left and right sides are changed along a circumference of the workpiece. With such a configuration, even when a workpiece has a circular shape where the discharge of the fluid is difficult compared to a rectangular shape, a uniform amount of discharge can be acquired.

According to the fourth aspect, the head unit has a shorter length than the workpiece. Accordingly, there is no possibility that a pressure to be applied to a workpiece from the discharge heads is not always uniformly distributed so that an amount of discharge varies. Therefore, a uniform pressure can be applied to the workpiece. Further, the head units move in the horizontal direction above the workpiece in synchronism with each other and hence, there is no discharge leakage whereby the fluid of a stable amount of discharge can be discharged. Accordingly, it is possible to eliminate a large amount of correction which is conventionally required on applying the fluid into a fine mask for a workpiece and hence, productivity can be remarkably enhanced.

According to a fifth aspect of the present invention, there is provided a fluid discharge device for applying fluid on an electronic component workpiece. The fluid discharge device includes: a first stage for supporting the workpiece; a first discharge head configured to discharge the fluid while moving in a straight line in a horizontal direction above the workpiece, and to move from an initial position located outside the first stage to a final position located outside the first stage through an area above the first stage; a second discharge head configured to discharge the fluid while changing an arrangement angle of the second discharge head and moving in the horizontal direction above the first stage; and a second stage disposed, on a movement path of the first discharge head, from the initial position to an outer edge of the first stage and from an outer edge of the first stage to the final position, and disposed such that the discharge head is slidable on the second stage. A range in which the fluid can be discharged in each of the first discharge head and the second discharge head is smaller than a width of a region on the first stage where the workpiece is disposed.

According to the fluid discharge device of the fifth aspect, the fluid is discharged using a plurality of discharge heads having a smaller size than the workpiece. Accordingly, even when a workpiece having a large size is processed, a pressure to be applied to the workpiece from the discharge heads is approximately uniformly distributed. Therefore, the amount of discharge from the discharge heads is stabilized. Further, the second movable stage is disposed on the movement path of the first discharge head at a position outside the first stage and hence, the first discharge head can apply the fluid from an outer edge to another outer edge of the workpiece. Further, the second discharge head moves while changing the arrangement angle of the second discharge head and hence, even when the application is started from a position on the workpiece, the fluid can be discharged in a wide range.

According to a sixth aspect of the present invention, in the fifth aspect, the second discharge head includes two discharge heads. The two discharge heads are respectively disposed on both sides of the first discharge head. According to the sixth aspect, the fluid can be efficiently applied to approximately the whole region of the workpiece having a circular shape.

According to a seventh aspect of the present invention, in the fifth or sixth aspect, the first discharge head and the second discharge head are configured to move simultaneously in synchronism with each other. According to the seventh aspect, a processing time can be shortened.

According to an eighth aspect of the present invention, in any one of the fifth to seventh aspects, the first discharge head and the second discharge head are configured to cover, in cooperation with each other, a region on the workpiece where the fluid is to be discharged substantially without causing overlapping. According to the eighth aspect, the fluid can be efficiently applied. Further, the fluid is not applied to the same portion a plurality of times. Accordingly, a variation in application amount can be suppressed.

According to a ninth aspect of the present invention, in any one of the fifth to eighth aspects, the range in which the fluid can be discharged in each of the first discharge head and the second discharge head is set to ¼ or more and ½ or less of a width of the region on the first stage where the workpiece is disposed. According to the ninth aspect, the advantageous effect of the fifth aspect can be acquired without making the configuration of the device excessively complicated.

DESCRIPTION OF EMBODIMENTS

A. First Embodiment

Figure 1:
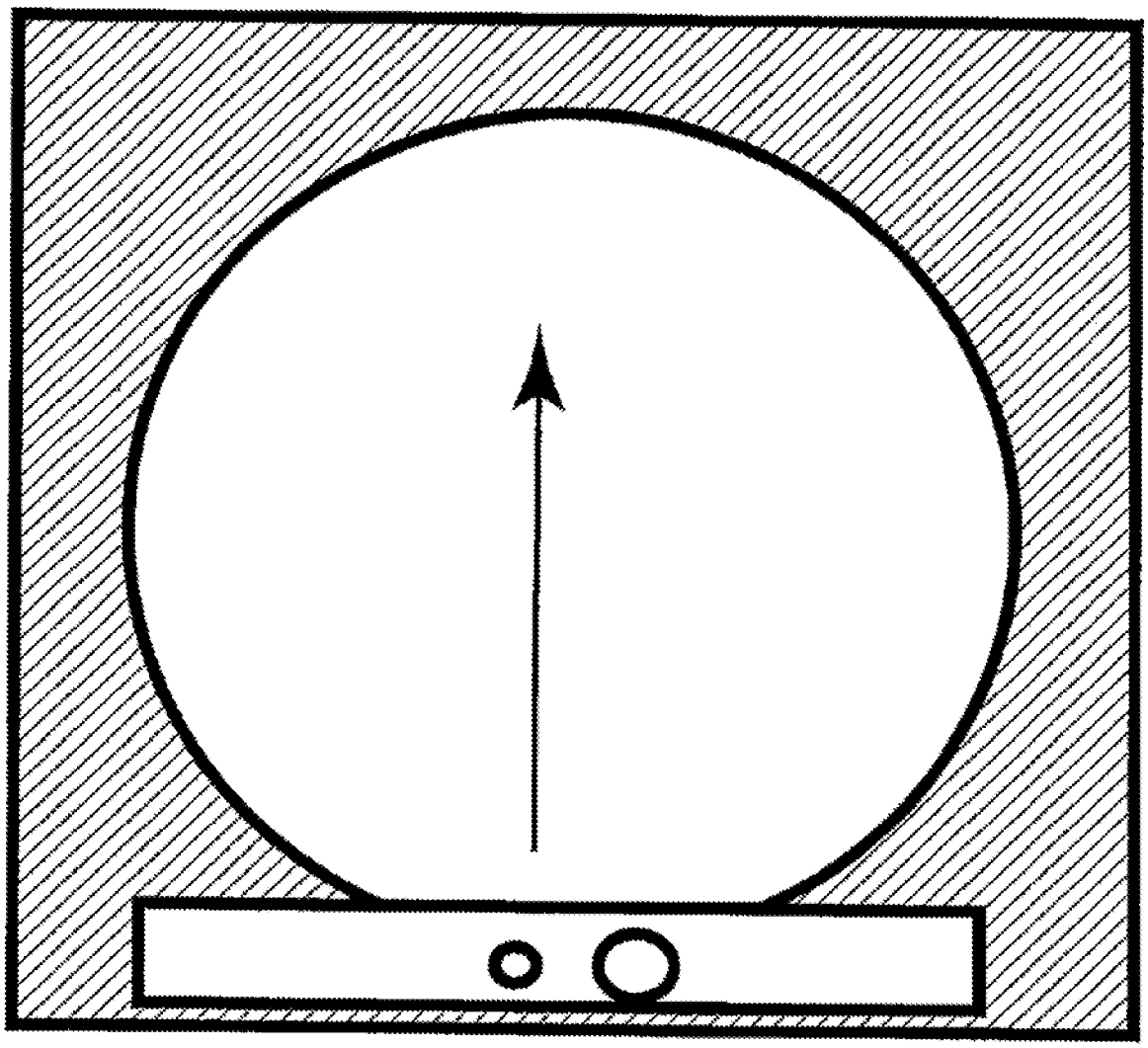
FIG. 1 is a schematic view showing a discharge head of a conventional fluid application device.
Figure 2:
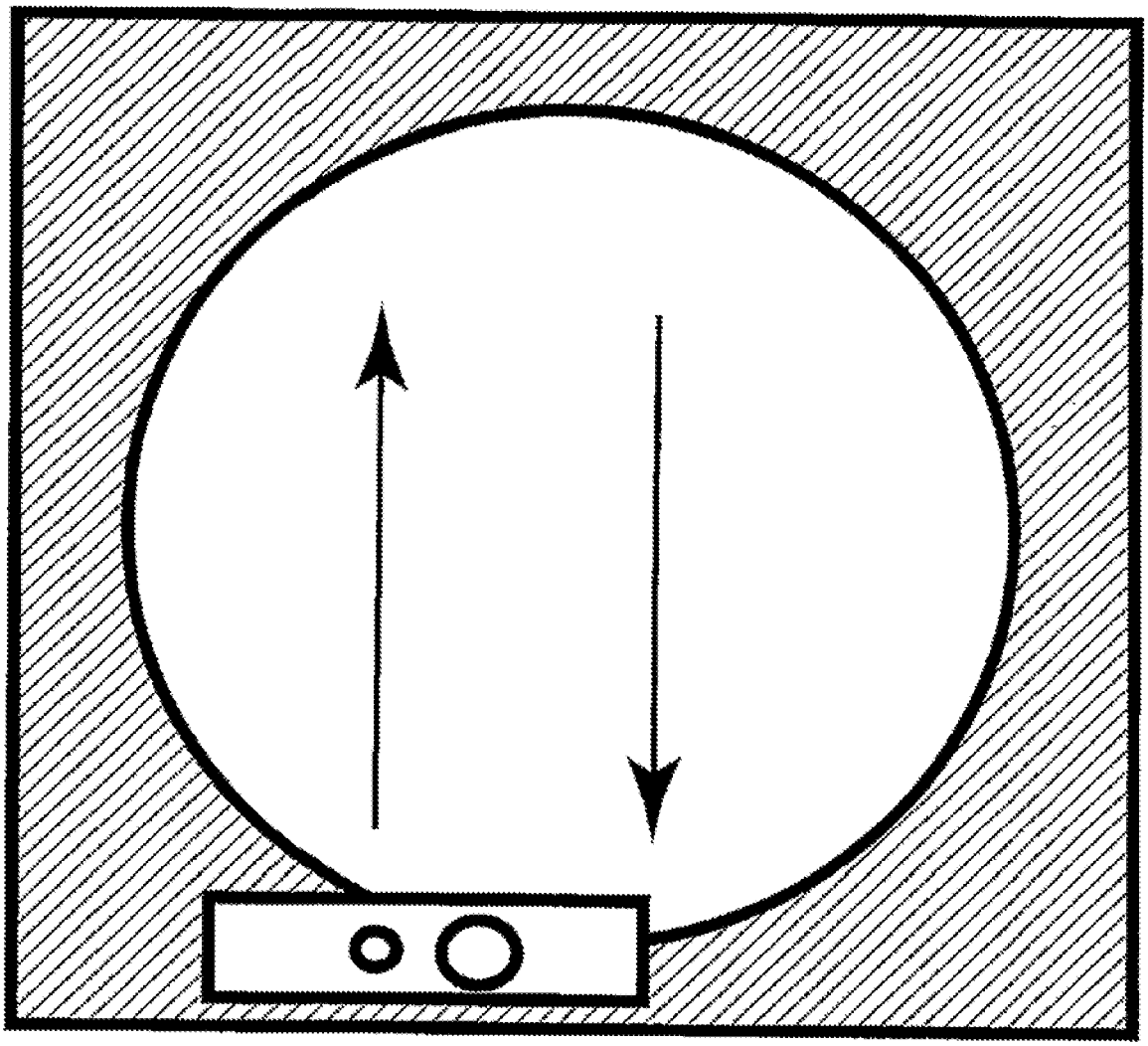
FIG. 2 is a schematic view showing a discharge head of a fluid application device according to one embodiment of the present invention.
Figure 3:
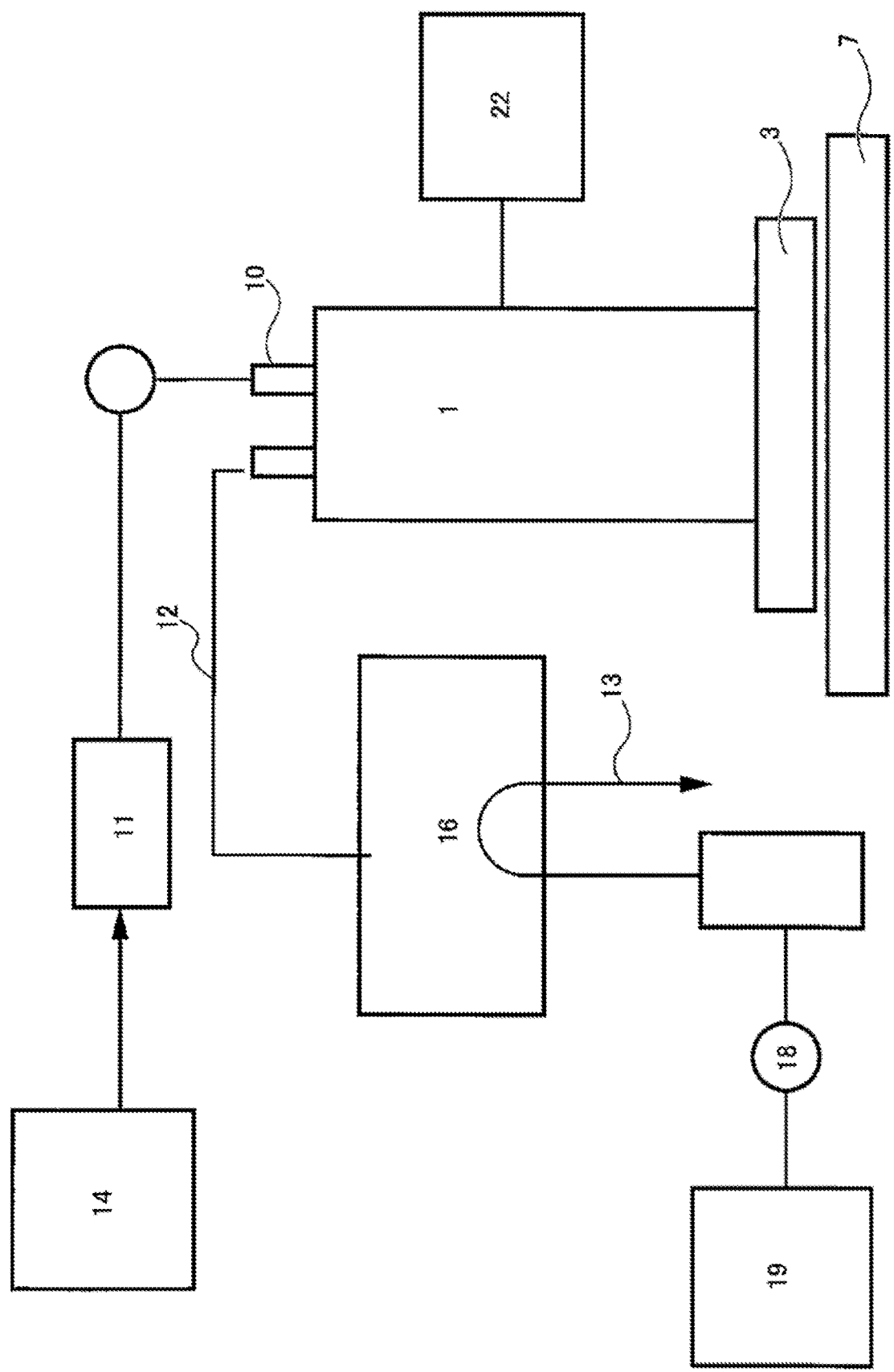
FIG. 3 is a schematic configuration diagram of the fluid application device according to one embodiment of the present invention.

First, a configuration of a head unit 1 of a fluid application device is described. FIG. 3 is a view showing details of the head unit 1 according to the present invention. The head unit 1 includes a fluid tank 2 which can store molten solder or the like, and a discharge head 3 which is formed on a lower end of the head unit 1. When fluid which requires a temperature control, such as molten solder, is used, a heating means may be mounted at the fluid tank 2. For example, a heater 4 may be wound around a side portion of the fluid tank 2. The discharge head 3 has a fluid discharge nozzle 5 and suction ports 6 which are formed at a lower end of the head. The suction ports 6 are formed in the discharge head 3 such that a suction step can be performed prior to a step performed by the fluid discharge nozzle 5 in the traveling direction. When fluid which requires a temperature control is used also in the fluid discharge nozzle 5 and the suction ports 6, a heater 4 may also be mounted at a lower end of the discharge head 3.

Figure 4:
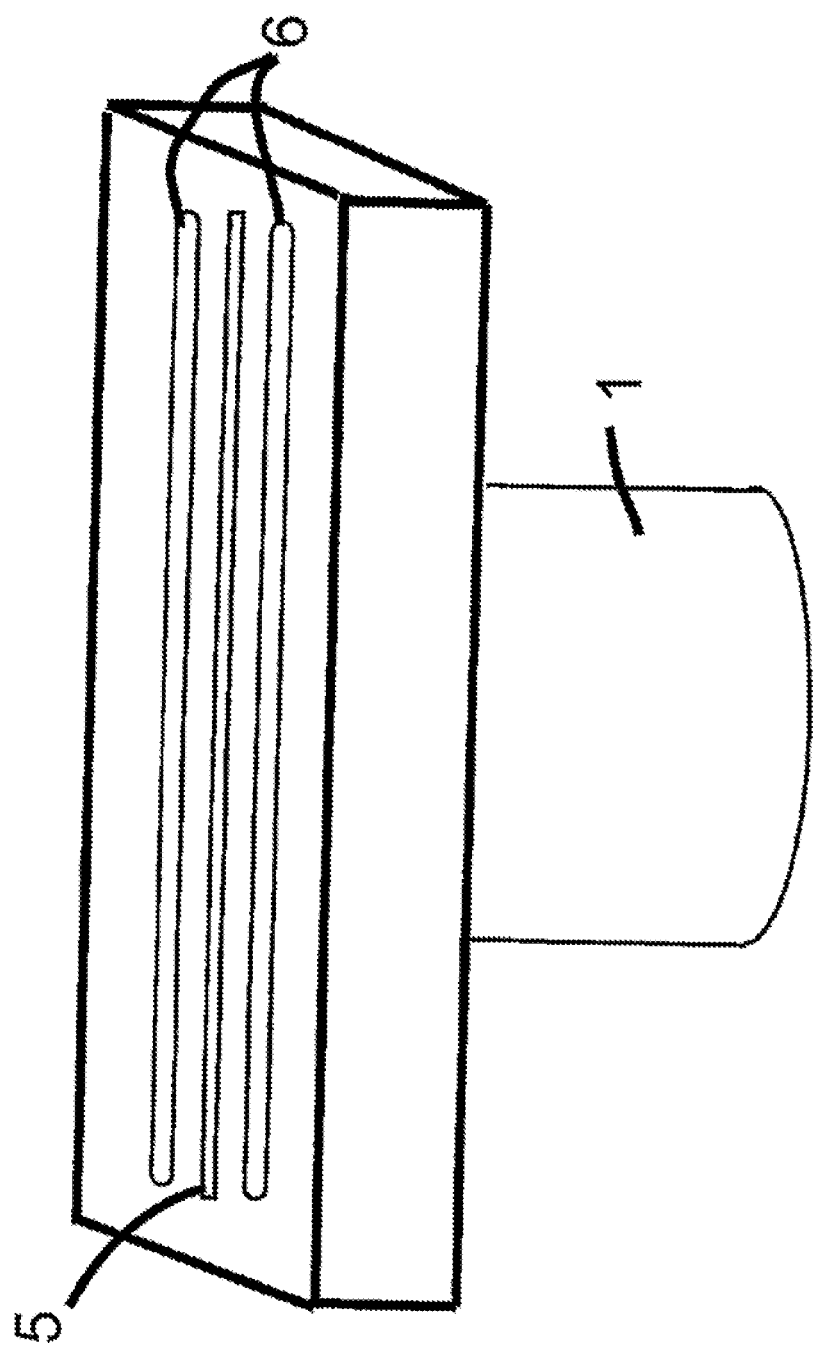
FIG. 4 is a schematic view showing the discharge head of the fluid application device according to one embodiment of the present invention.

A circular shape, a slit shape or any other known shape may be adopted as the shape of a nozzle opening of the discharge head 3. Particularly, with the use of a slit shape as the shape of the nozzle opening, the fluid can be discharged to a plurality of discharge targets on a workpiece 7 simultaneously. A circular shape, a slit shape or any other known shape may be adopted also as the shape of the suction port 6 formed in the discharge head 3. However, with the use of a slit shape as the shape of the opening, air or the fluid which has already discharged in a mask 8 can be simultaneously removed with respect to a plurality of portions on the workpiece 7 such as a silicon wafer or a printed circuit board. Further, in the present application, the suction port 6 is formed in front of and behind the discharge head 3 as shown in FIG. 4 so that the deformation of the mask can be made uniform. Accordingly, the fluid can be stably discharged in a reciprocating manner.

Next, the overall configuration is described. As shown in FIG. 3, the fluid application device of the present invention is movable in the upward and downward direction (Y) as a whole such that the fluid application device approaches and separates from the electronic component workpiece 7 to which the fluid is to be applied. The fluid application device is movable also in the horizontal direction (X). The mask 8 which is made from polyimide or a resist is placed on an upper portion of the workpiece 7. On discharging the fluid, the discharge head 3 descends to a position where the fluid discharge nozzle 5 comes into contact with the workpiece 7. The liquid discharge head 3 moves horizontally while maintaining a contact state between the fluid discharge nozzle 5 and the workpiece 7. When the discharge head 3 moves horizontally, first, air in the mask 8, which is installed on the workpiece 7, is sucked through the suction port 6 formed in the discharge head 3 such that a suction step can be performed first in the traveling direction. The fluid discharged into the mask 8 by a second or later discharge can be also sucked at this stage of operation. When fluid which requires a heating means is used, the fluid is heated by the heater 4 provided at a lower portion of the discharge head 3, thus allowing the fluid to be sucked. Thereafter, when the liquid discharge head 3 moves horizontally, the fluid is discharged from the opening of the fluid discharge nozzle 5 so that the fluid is applied into the mask 8 on the workpiece 7. When the application of the fluid is finished, the liquid discharge head 3 is raised so as to separate from the workpiece 7. The same step may be performed also in the case where the mask 8 is not used.

The fluid discharge device 1 includes the heater 4 for maintaining the fluid in the tank 2 at a desired temperature. The heater 4 may be incorporated in a wall portion of the tank 2. The heater 4 is managed and controlled so as to heat to an appropriate temperature for maintaining a viscosity of the fluid 9 in the tank 2, such as molten solder, which viscosity is optimal for conditions for applying the fluid 9.

Although not shown in the drawing, the fluid discharge device 1 is connected to a pressure supply means 11, which allows fluid communication, through an extension pipeline 10 from the tank 2. The fluid discharge device 1 is connected to a reduced pressure supply means 13, which allows fluid communication, through a suction pipe extension pipeline 12 which continues from the suction port 6. The pressure supply means 11 includes a pressure generating source 14 which generates a nitrogen gas of a pressure of 0.06 to 0.1 MPa (not limited to such a value), for example. The pressure generating source 14 supplies a pressure into the tank 2 through a gate valve 15 and a three-way valve 16. Molten solder held in the tank 2 is injected from the opening of the fluid discharge nozzle 5 by a pressure from the pressure generating source 14.

The reduced pressure supply means 13 includes a micro ejector 16 which is a reduced pressure generating device. The reduced pressure generating device 16 is connected to a pressure generating source 19, which generates a nitrogen gas of a pressure of 0.4 MPa (not limited to such a value), through a regulator 17 and a throttle valve 18, for example. The reduced pressure generating device 16 supplies a negative pressure to the suction port 6 through the suction pipe extension pipeline 12.

The fluid discharge device includes a pressure sensor 20 and a controller 21. The pressure sensor 20 is connected to the three-way valve 18 disposed in the extension pipeline 17 in fluid communication with the inside of the tank 2, and the pressure sensor 20 monitors a pressure in the tank 2. A signal indicating a pressure in the tank 2 is transmitted to the controller 21 from the pressure sensor 20. The controller 21 operates the pressure generating source 14, the reduced pressure generating device 16, the regulator 17, the pressure generating source 19 and the respective valves according to the progress of the operating steps to supply a pressure into the tank 2. An appropriate value of pressure required to be supplied is determined based on a signal from the pressure sensor 20. When molten solder in the tank 2 is injected from the opening of the fluid discharge nozzle 5, the operation is performed so as to allow fluid communication between the inside of the tank 2 and the pressure sensor 20. A magnitude of positive pressure to be supplied into the tank 2 can be varied by adjusting a value of pressure generated by the pressure generating source 14, for example. Alternatively, a value of pressure may be varied by adjusting, with use of the controller 21, a regulating valve (not shown in the drawing) disposed in the pressure supply means 11.

An appropriate value of pressure, which is required to be supplied into the tank 2, for causing fluid such as molten solder to be injected from the opening of the fluid discharge nozzle 5 or for holding the fluid in the tank 2 is influenced also by an amount (weight) of molten solder stored in the tank 2. Accordingly, the controller 21 may be configured to receive data relating to the amount of fluid in the tank 2. In this case, the controller 21 can calculate an appropriate value of pressure in the tank for injecting the fluid or for hold the fluid in the tank, from the data on the amount of fluid in the tank 2. Further, the controller 21 can compare the appropriate value of pressure in the tank and an actual value of pressure in the tank, which the signal from the pressure sensor 20 indicates, to adjust the pressure generating source 14 and the respective valves such that an appropriate pressure in the tank is obtained.

To reduce fluctuations in the above-mentioned appropriate value of pressure in the tank, which are caused by fluctuations in the amount of fluid in the tank 2, as much as possible, the fluid supply device 22 may be provided such that the fluid supply device 22 is connected to the tank 2. When molten solder in the tank 2 is consumed during the operation of the fluid discharge device, the fluid supply device 22 can automatically supply an additional fluid such that the amount of fluid in the tank 2 is always kept approximately constant. Any known method can be used so as to acquire the amount of fluid in the tank 2. The amount of molten solder in the tank 2 can be inferred from the number of products processed or the like. When the above-mentioned appropriate value of pressure in the tank which corresponds to the amount of fluid in the tank can be acquired empirically, the controller 21 can control a pressure which is to be supplied into the tank 2 only based on a signal from the pressure sensor 20.

Finally, the operation of the fluid discharge device of the first embodiment is described. The discharge head 3 of the first embodiment is fixed at a fixed position separated from the workpiece 7 at a distance. However, on discharging the fluid, the discharge head 3 moves in the upward and downward direction as well as in the horizontal direction so that the discharge head 3 descends to a position where the discharge head 3 comes into contact with a discharge portion of the mask 8 on the workpiece 7. A pressure supplied from the pressure generating source 14 is supplied into the tank 2 through the gate valve 15. The fluid 9 held in the tank 2 is injected from the opening of the discharge nozzle 5 by the pressure from the pressure generating source 14. The discharge heads 3 move such that the discharge heads 3 which are discharging the fluid 9 always horizontally move so that the side where the suction nozzle 5 is provided is located forward, and the discharge nozzle 5 discharges the fluid after a pressure of air in an opening portion of the mask 8 on the workpiece 7 is reduced. After discharging the fluid in one direction into the opening portion of the mask 8 on the workpiece 7 is finished, then, the return movement of the discharge head 3 is performed. With such operations, a reciprocating movement of the discharge head 3 is completed. According to the above-mentioned operations, the discharge head 3 discharges the fluid while performing a reciprocating operation with respect to the workpiece 7. Therefore, the deformation of the mask is not biased in one direction so that the deformation of the mask can be reduced.

B. Second Embodiment

Hereinafter, a second embodiment of the present invention is described mainly with respect to points which differ from those of the first embodiment. The configurations of the second embodiment are equal to the corresponding configurations of the first embodiment unless otherwise specified.

Figure 7:
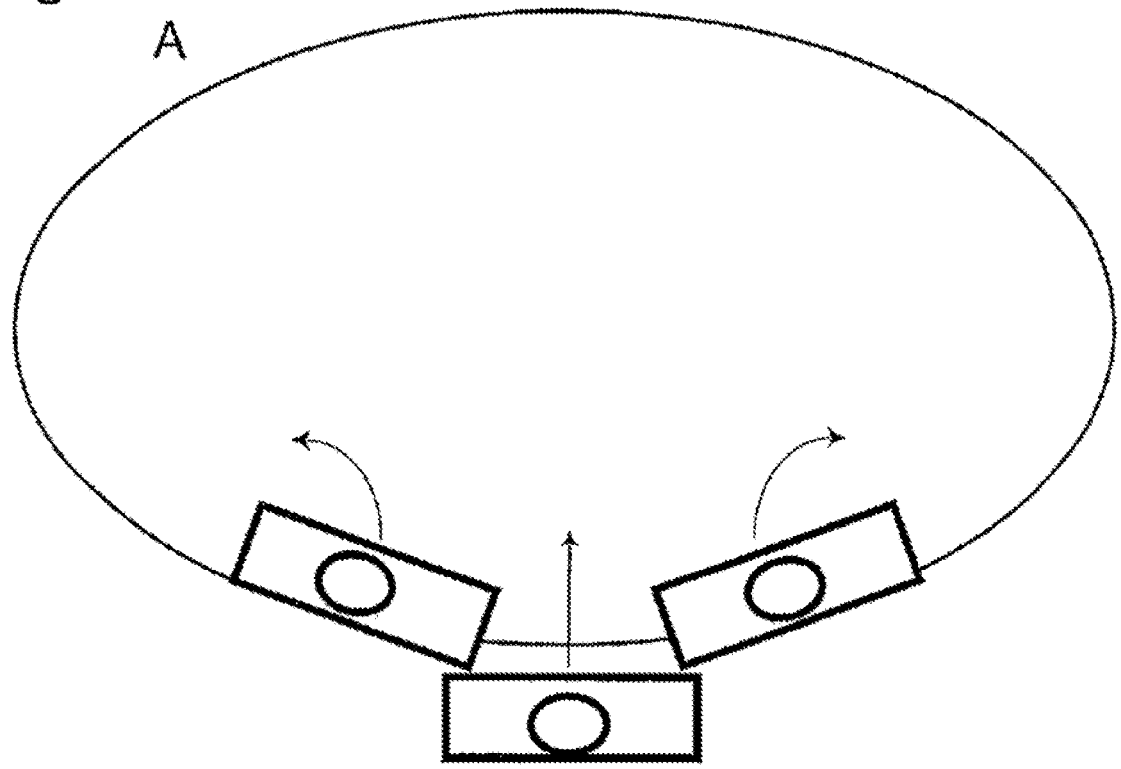
FIG. 7 is a view showing movement paths of the discharge heads.
Figure 7:
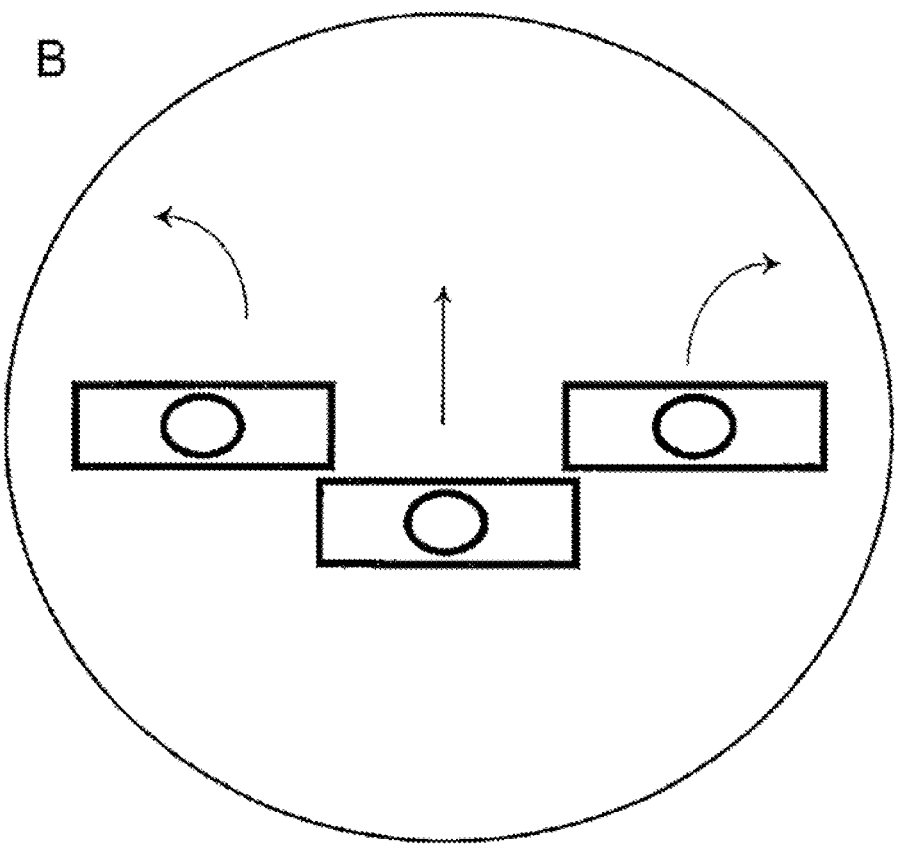

The operation of a fluid discharge device of the second embodiment is described. Head units 1 in the second embodiment are fixed at fixed positions separated from a workpiece 7 at a distance. However, on discharging the fluid, the head units 1 move in the upward and downward direction as well as in the horizontal direction so that the discharge heads 3 descend to the position where the discharge heads 3 come into contact with discharge portions of a mask 8 on the workpiece 7. FIG. 7A illustrates one example showing a state where the plurality of head units 1 descend on discharging the fluid to a silicon wafer. The fluid discharge device of the second embodiment includes three head units 1. The center head unit is disposed parallel to the traveling direction. The left and right head units are disposed along a workpiece having a circular shape, thus being disposed non-parallel to the traveling direction. When the head units 1 descend from an initial position, the head units 1 are held in a state where the left head unit is rotated clockwise by 10 to 60 degrees, the center head unit is parallel to the workpiece, and the right head unit is rotated counterclockwise by 10 to 60 degrees. Distal ends of the left and right head units on the center side of the workpiece are disposed forward, in the traveling direction, of the head unit 1 disposed at the center. When the heads move horizontally in the traveling direction, the left head unit turns counterclockwise, and the right head unit turns clockwise so that the left and right head units approach a state parallel to the traveling direction.

Figure 8:
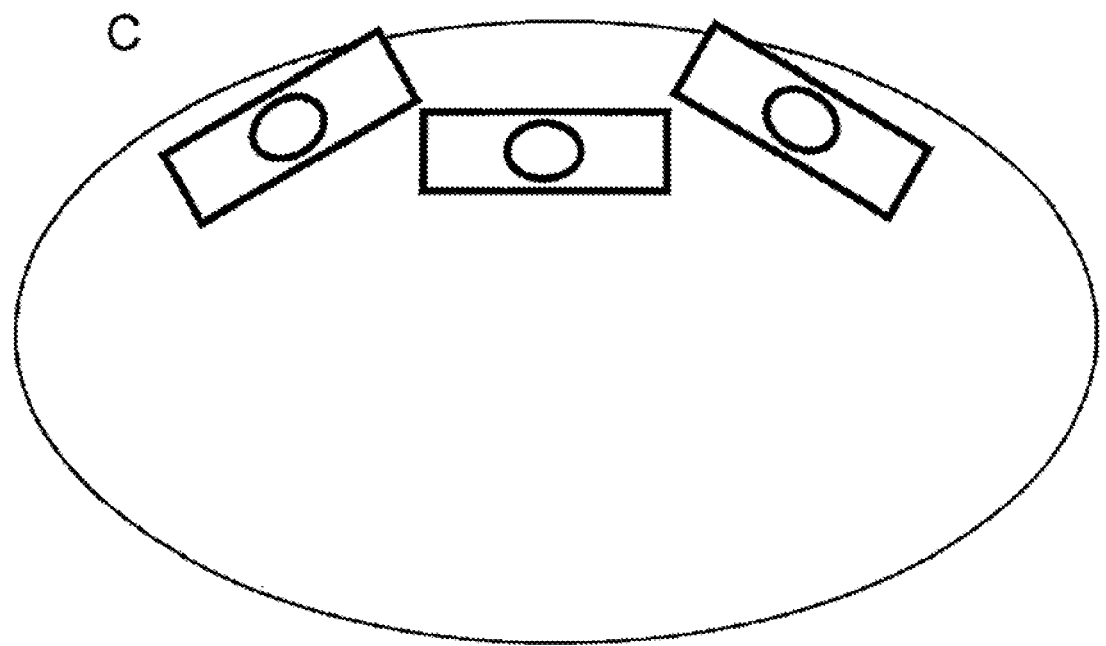
FIG. 8 is a view showing the movement paths of the discharge heads.
Figure 8:
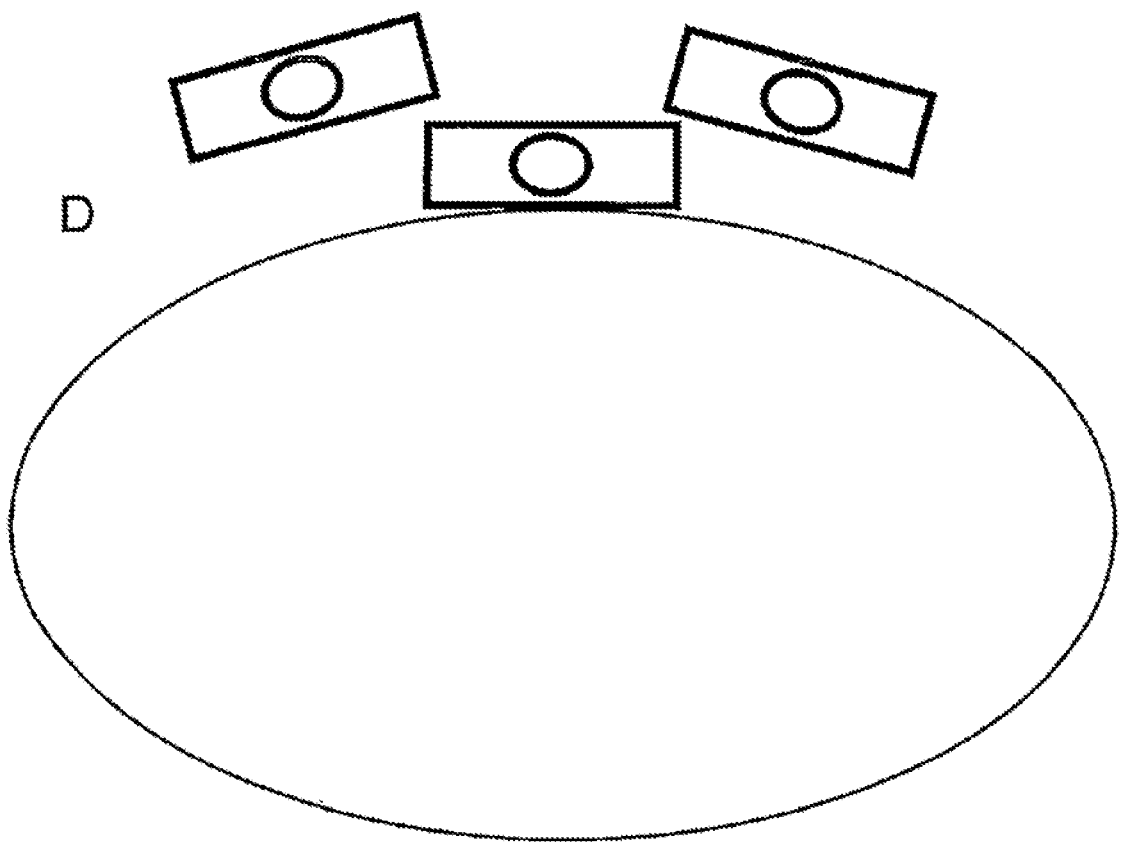

FIG. 7B illustrates one example showing a state where the three head units 1 are in the vicinity of a center portion of a silicon wafer. All of the center, left and right head units 1 are parallel to the traveling direction. When three head units 1 move past the center portion of the silicon wafer, the left head unit turns counterclockwise, and the right head unit turns clockwise. FIG. 8C shows a state where the three head units 1 reach a final position. When the head units 1 are at the final position, the head units 1 are held in a state where the left head unit is rotated counterclockwise by 10 to 60 degrees, the center head unit is parallel to the workpiece, and the right head unit is rotated clockwise by 10 to 60 degrees. In such a state, in contrast to the initial position, the center head unit 1 is parallel to the traveling direction, and the left and right head units are disposed along the workpiece having a circular shape, thus being non-parallel to the traveling direction. The distal ends of the left and right head units on the center side of the workpiece are disposed forward, in the traveling direction, of the head unit disposed at the center. FIG. 8D shows a state where the three head units move to positions outside the silicon wafer to remove the mask. In such a position, in the same manner as the state shown in FIG. 8C, the center head unit is parallel to the traveling direction, and the left and right head units are disposed along the workpiece having a circular shape, thus being non-parallel to the traveling direction. The distal ends of the left and right head units on the center side of the workpiece are disposed forward, in the traveling direction, of the head unit disposed at the center. The left and right head units of the fluid discharge device of the present invention can turn above a workpiece toward an outer periphery of the workpiece by 10 to 60 degrees on moving from the initial position to the final position.

The discharge heads 3 moves such that the discharge heads 3 which are discharging the fluid 9 horizontally move so that the side where the suction nozzle 5 is provided is located forward, and the discharge nozzle 5 discharges the fluid after a pressure of air in an opening portion of the mask 8 on the workpiece 7 is reduced. A pressure supplied from the pressure generating source 14 is supplied into the tank 2 through a gate valve 15. The fluid 9 held in the tank 2 is injected from the opening of the discharge nozzle 5 by a pressure from the pressure generating source 14. The discharge heads 3 move horizontally while being in contact with an upper surface of the mask 8 on the workpiece 7, and the application of the fluid within a determined range is completed. According to the above-mentioned operations in this embodiment, the fluid is discharged using the plurality of discharge heads 3 having a smaller size than the workpiece 7. Accordingly, it is possible to suppress variation in the amount of discharge so that the amount of discharge can be stabilized.

Figure 9:
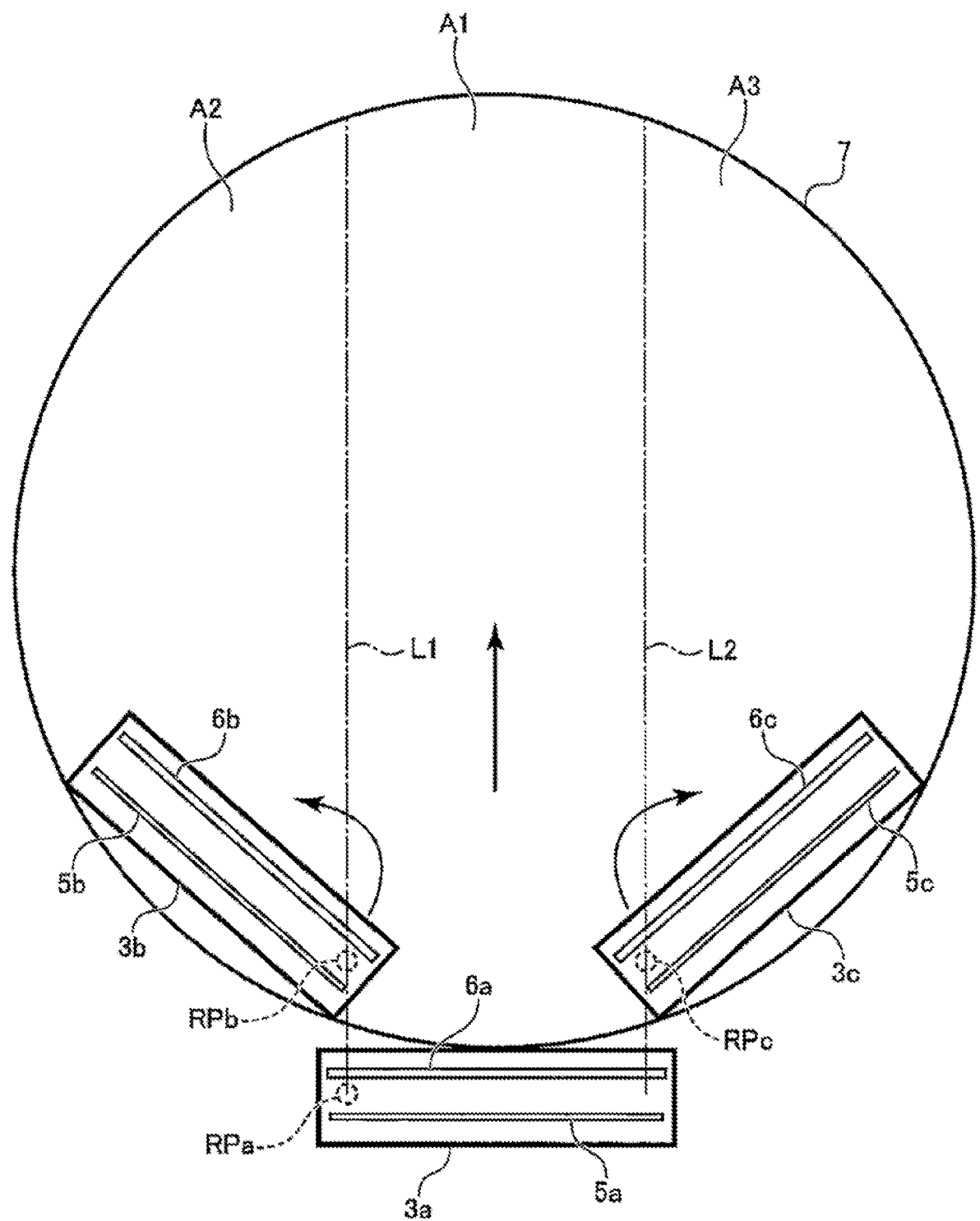
FIG. 9 is a view showing the movement paths of the discharge heads.
Figure 10:
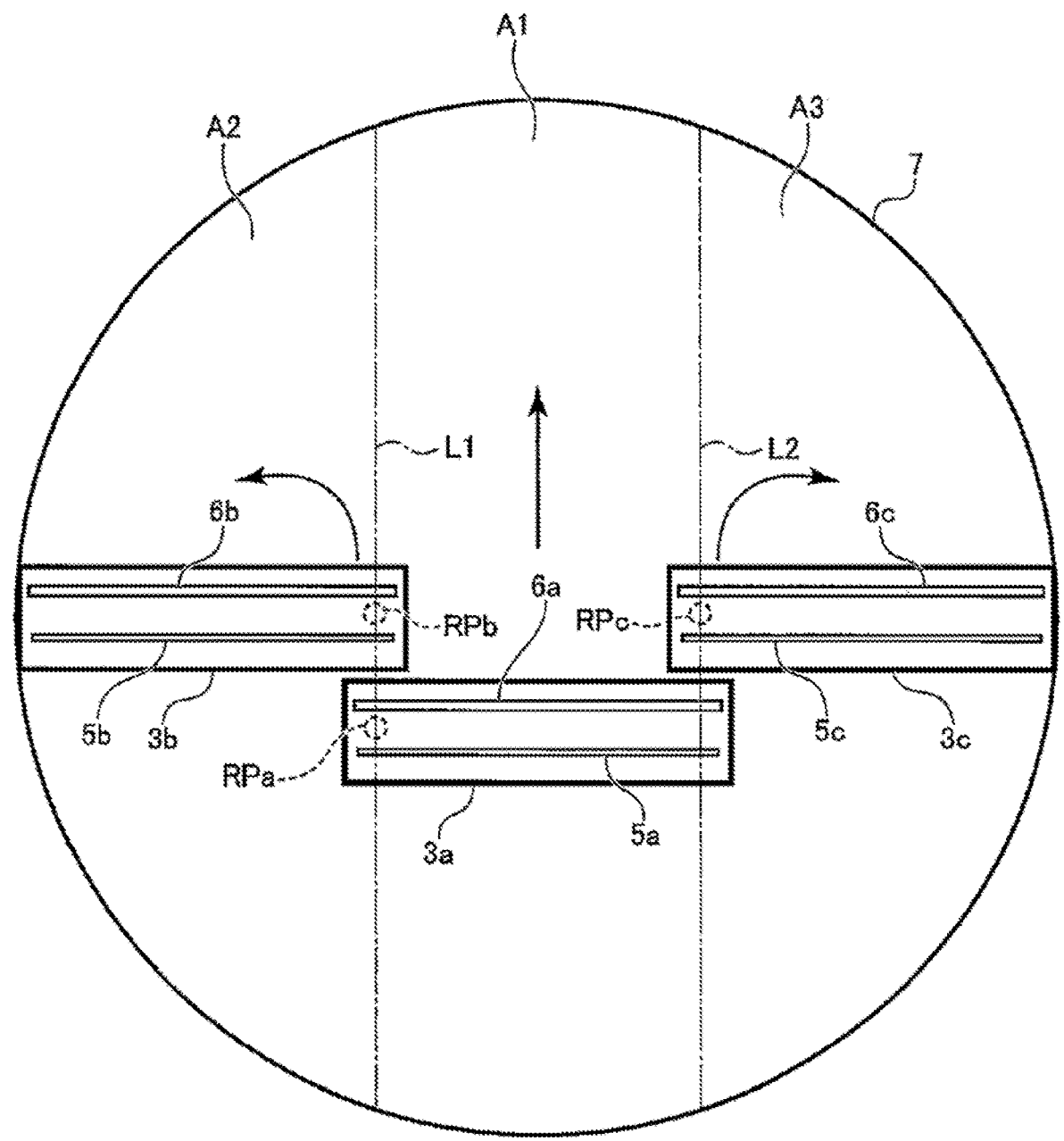
FIG. 10 is a view showing the movement paths of the discharge heads.
Figure 11:
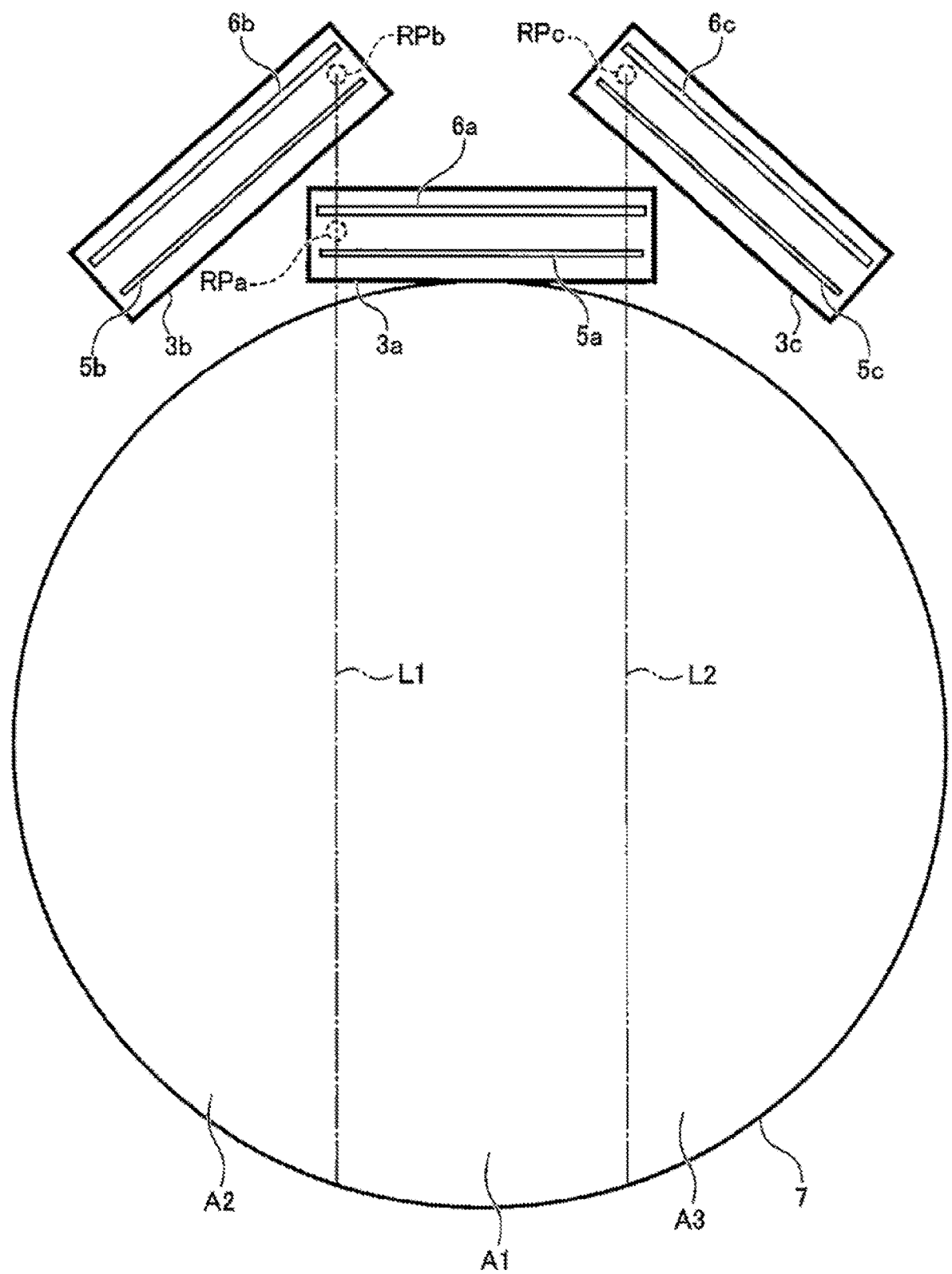
FIG. 11 is a view showing the movement paths of the discharge heads.

FIGS. 9 to 11 show specific example of movement paths of discharge heads 3a to 3c. FIG. 9 shows the initial position of the discharge heads 3a to 3c before scanning is performed. The first discharge head 3a is disposed outside the workpiece 7. The longitudinal direction of the first discharge head 3a is perpendicular to the traveling direction of the first discharge head 3a (the direction toward the upper side of the paper). The second discharge heads 3b, 3c are disposed so as to be in contact with an inner periphery of the workpiece 7 having a circular shape. In other words, the second discharge heads 3b, 3c are disposed forward of the first discharge head 3a in the traveling direction. The longitudinal directions of the second discharge heads 3b, 3c are inclined with respect to the traveling direction of the discharge heads 3a to 3c (the direction toward the upper side of the paper). Such an inclination may be set to an angle of 10 to 60 degrees with respect to the traveling direction, for example. The second discharge head 3b turns counterclockwise as the second discharge head 3b travels in the traveling direction, and the second discharge head 3c turns clockwise as the second discharge head 3c travels in the traveling direction. The operation where the second discharge heads 3b, 3c travel in the traveling direction while turning can be realized by a robot arm, for example.

FIG. 10 shows the discharge heads 3a to 3c at the intermediate position during scanning. The first discharge head 3a moves in a straight line from the initial position shown in FIG. 9 to the center of the workpiece 7. A reference point RPa of the first discharge head 3a moves along a straight line L1. The second discharge heads 3b, 3c travel in the traveling direction from the initial position shown in FIG. 9 while turning so that the second discharge heads 3b, 3c are disposed at the same arrangement angle as the first discharge head 3a. That is, the longitudinal direction of the first discharge head 3a is parallel to the longitudinal directions of the second discharge heads 3b, 3c. In this turning movement, reference points RPb, RPc of the second discharge heads 3b, 3c respectively move along the straight lines L1, L2. The reference points RPb, RPc are set at end portions of the discharge nozzles 5 on the first discharge head 3a side.

FIG. 11 shows the final position of the discharge heads 3a to 3c after the scanning is finished. The first discharge head 3a moves to the position outside the workpiece 7 (the position outside the workpiece 7 on the side opposite to the initial position) from the intermediate position shown in FIG. 10. The second discharge heads 3b, 3c travel in the traveling direction from the intermediate position shown in FIG. 10 while turning so that the second discharge heads 3b, 3c are inclined with respect to the traveling direction of the discharge heads 3a to 3c (the direction toward the upper side of the paper). The direction of this inclination is opposite to the direction of the inclination at the initial position. This inclination may be set to an angle of 10 to 60 degrees with respect to the traveling direction, for example.

The discharge heads 3a to 3c move as described above so that the fluid 9 can be applied to approximately the whole region of the workpiece 7. To be more specific, the application of the fluid 9 for a center region A1 is covered by the first discharge head 3*a*. The application of the fluid 9 for a left region A2 is covered by the second discharge head 3*b* on the left side. The application of the fluid 9 for a right region A3 is covered by the second discharge head 3*c* on the right side. By adjusting regions where the discharge nozzles 5*a* to 5*c* of the discharge heads 3*a* to 3*c* are formed and the reference positions RP1 to RP3, it is possible to cover a region on the workpiece 7 where the fluid is to be discharged substantially without causing the overlapping.

C. Third Embodiment

Hereinafter, a third embodiment of the present invention is described. FIG. 3 is a schematic view showing a schematic configuration of a solder bump forming device which is one example of a fluid application device according to a third embodiment. The solder bump forming device is a device which applies fluid 9 (molten solder in this embodiment) on an electronic component workpiece 7 (for example, a silicon wafer, a printed circuit board or the like) to form solder bumps. As shown in FIG. 3, the solder bump forming device includes a discharge head unit 1, a pressure supply means 11, a pressure generating source 14, a micro ejector 16, a pressure generating source 19, and a fluid supply device 22. The solder bump forming device also includes stages 30 to 32 (see FIG. 12). The details of such configurations are described later.

Figure 5:
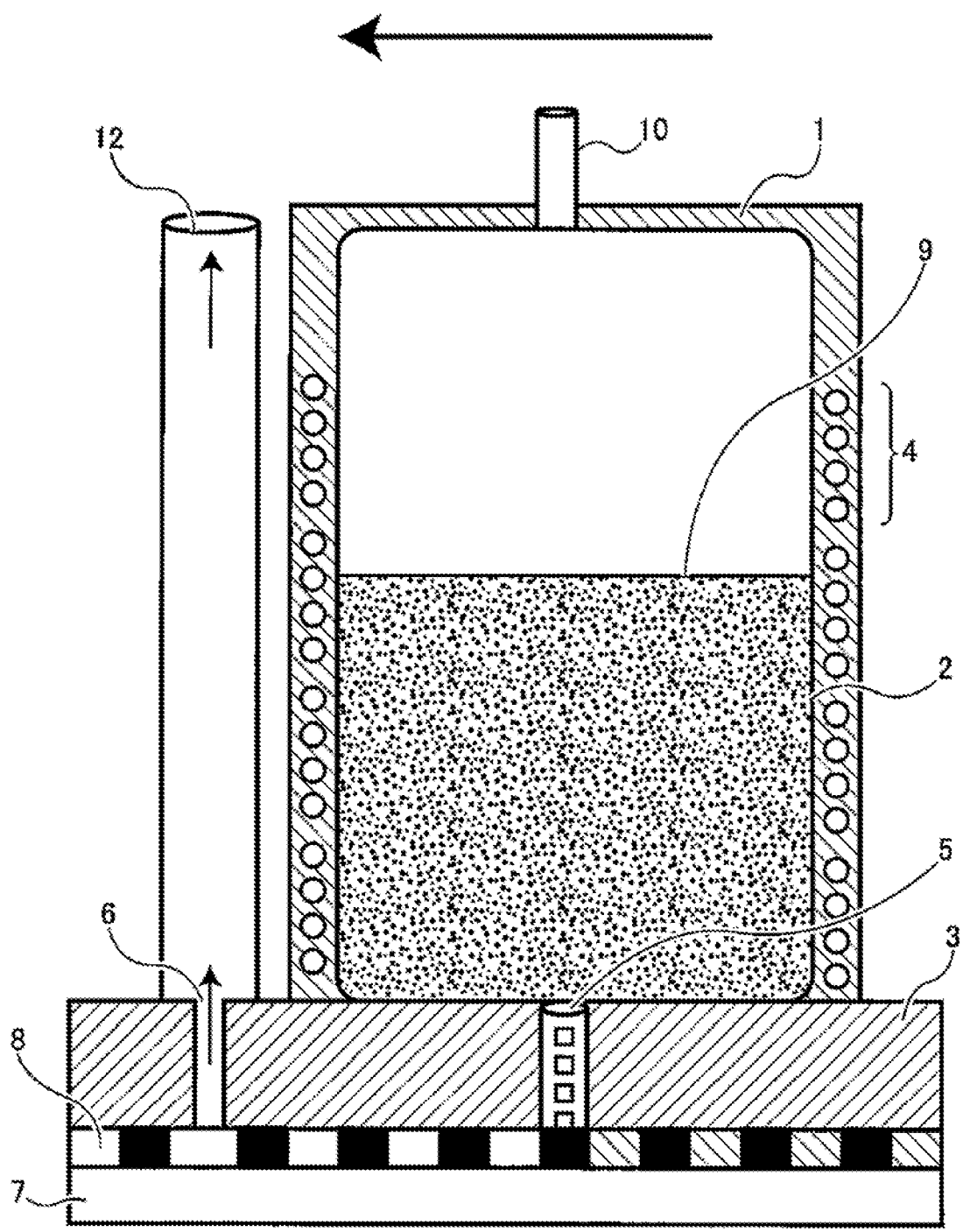
FIG. 5 is a detail view showing a configuration of the discharge head of the fluid application device according to one embodiment of the present invention.
Figure 6:
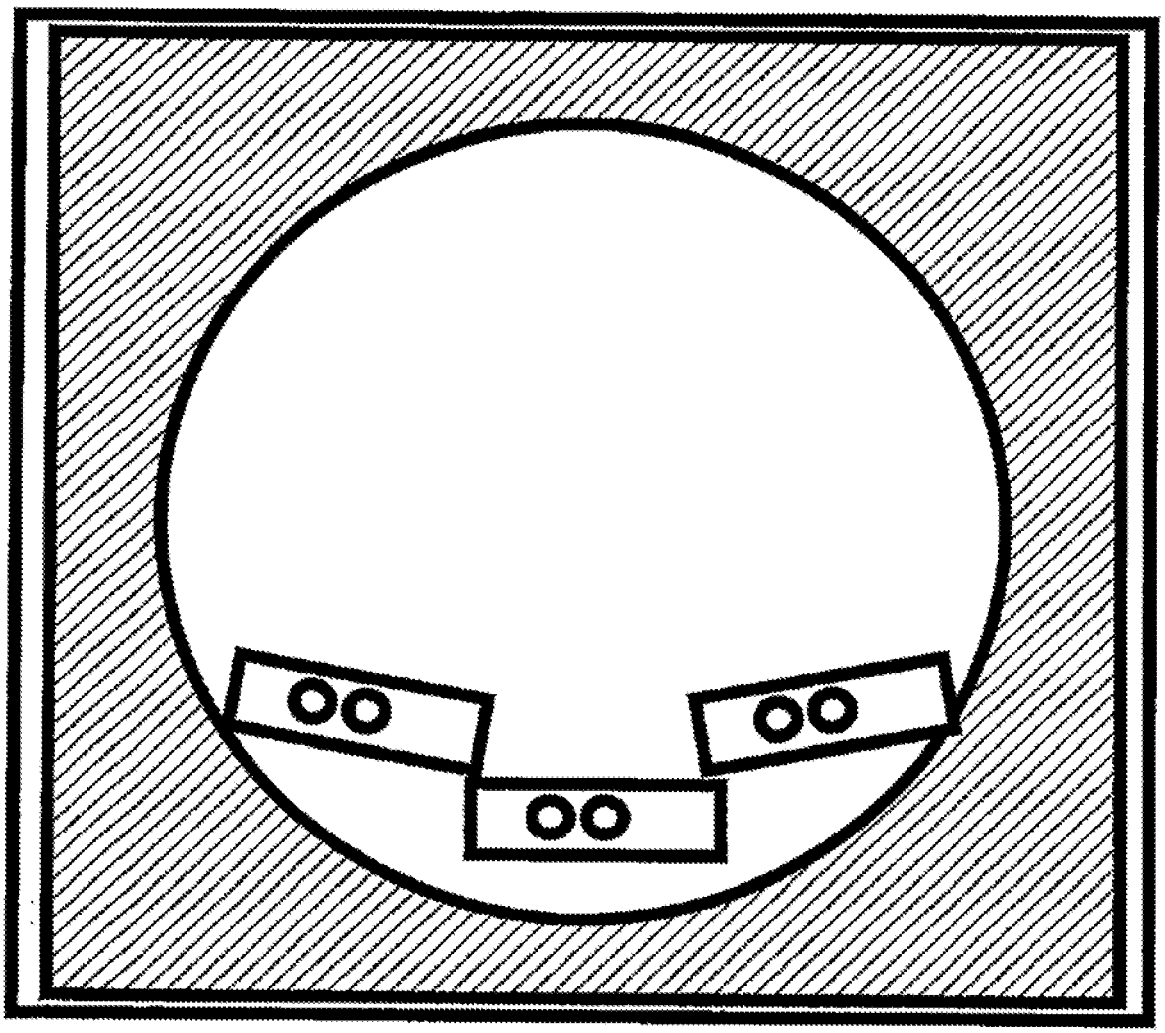
FIG. 6 is a schematic view showing discharge heads of a fluid application device according to a second embodiment of the present invention.

FIG. 5 is a schematic view showing the discharge head unit 1 of the solder bump forming device. As shown in FIG. 5, the discharge head unit 1 includes a fluid tank 2 which can store the fluid 9, and a discharge head 3 which is formed on a lower end of the discharge head unit 1. The discharge head unit 1 is configured such that the discharge head unit 1 can be moved in the horizontal direction above the workpiece 7 by any actuator (not shown in the drawing). In this embodiment, the discharge head unit 1 slidingly moves on a mask 8 disposed on the workpiece 7. The mask 8 has a plurality of hole portions formed at portions where solder bumps are to be formed. These hole portions penetrate the mask 8 in the thickness direction of the mask 8 (vertical direction). The mask 8 may be made from polyimide or a resist, for example. Further, the discharge head unit 1 is configured such that the discharge head unit 1 can be moved in the vertical direction, that is, can be moved so as to approach and separate from the workpiece 7.

As shown in FIG. 3, the fluid tank 2 may be connected to the fluid supply device 22. The fluid supply device 22 can automatically replenish the fluid 9 when the fluid 9 in the tank 2 is consumed, such that the amount of fluid stored in the fluid tank 2 is always kept approximately constant. With such a configuration, it is possible to suppress fluctuations in pressure in the tank which are caused by fluctuations in the amount of fluid stored in the fluid tank 2.

In this embodiment, the discharge head unit 1 includes a heater 4 for maintaining the fluid 9 in the tank 2 at a desired temperature. The heater 4 may be incorporated in a wall portion of the tank 2. The heater 4 is controlled so as to heat the fluid 9 to an appropriate temperature for maintaining a viscosity of the fluid 9 in the tank 2 which viscosity is optimal for conditions for applying the fluid 9.

As shown in FIG. 5, the discharge head 3 has a discharge nozzle 5 and a suction port 6. The discharge nozzle 5 penetrates the discharge head 3 in the vertical direction thus communicating with the fluid tank 2. As shown in FIG. 3, the fluid tank 2 is connected to the pressure supply means 11 through an extension pipeline 10. The pressure supply means 11 includes a pressure generating source 14 which generates a nitrogen gas of a pressure of 0.06 to 0.1 MPa (not limited to such a value), for example. The pressure generating source 14 supplies a pressure to the discharge head unit 1 through a gate valve and a three-way valve. With the supply of such a pressure, the fluid 9 in the tank 2 is discharged from the discharge nozzle 5.

As shown in FIG. 5, the suction port 6 penetrates the discharge head 3 in the vertical direction thus communicating with the suction pipe extension pipeline 12. As shown in FIG. 3, the suction pipe extension pipeline 12 is connected to a reduced pressure supply means 13. The reduced pressure supply means 13 includes a micro ejector 16 which is a reduced pressure generating device. The micro ejector 16 is connected to a pressure generating source 19, which generates a nitrogen gas of a pressure of 0.4 MPa (not limited to such a value), through a regulator and a throttle valve 18, for example. The reduced pressure supply means 13 supplies a negative pressure to the suction port 6 through the suction pipe extension pipeline 12.

The suction port 6 is disposed forward of the discharge nozzle 5 in the traveling direction of the discharge head unit 1. Accordingly, the inside of the hole portions of the mask 8 can be degassed and decompressed through the suction port 6 before the fluid is discharged from the discharge nozzle 5. With such a configuration, a uniform amount of fluid can be stably discharged.

A circular shape, a slit shape or any other known shape may be adopted as the shape of an opening of the discharge nozzle 5. Particularly, when a slit shape is adopted as the shape of the opening of the discharge nozzle 5, the fluid can be discharged into a plurality of hole portions of the mask 8 simultaneously. A circular shape, a slit shape or any other known shape may be adopted also as the shape of an opening of the suction port 6. When a slit shape is adopted as the shape of the opening of the suction port 6, air and the fluid which has already discharged can be sucked at a plurality of portions simultaneously.

The operation of the above-mentioned solder bump forming device is schematically described hereinafter. On discharging the fluid, the discharge head unit 1 descends to a position where the discharge head 3 (that is, the opening portion positioned at the lower end of the discharge nozzle 5) comes into contact with the mask 8. Then, the discharge head 3 moves in the horizontal direction while maintaining a contact state between the discharge nozzle 5 and the mask 8. When the discharge head 3 moves horizontally, first, air in the hole portions of the mask 8 disposed on the workpiece 7 is sucked through the suction port 6 formed on the forward side of the discharge head 3 in the traveling direction. When the discharge head 3 scans above the same hole portion a plurality of times, the fluid 9 previously discharged into the hole portion is also sucked at this stage of operation. A heater may be disposed at a lower portion of the discharge head 3. With such a configuration, the fluid 9 previously discharged into the hole portion is not solidified. Accordingly, the fluid can be reliably sucked. Thereafter, when the discharge head 3 further moves horizontally, the fluid 9 is discharged from the opening of the discharge nozzle 5 into the hole portions of the mask 8 after the suction operation is performed by the suction port 6. With such operations, the fluid 9 is applied into the hole portions of the mask 8 on the workpiece 7. When the application of the fluid 9 is finished, the discharge head 3 is raised so as to separate from the mask 8. The same step may be performed also in the case where the mask 8 is not used.

Figure 12:
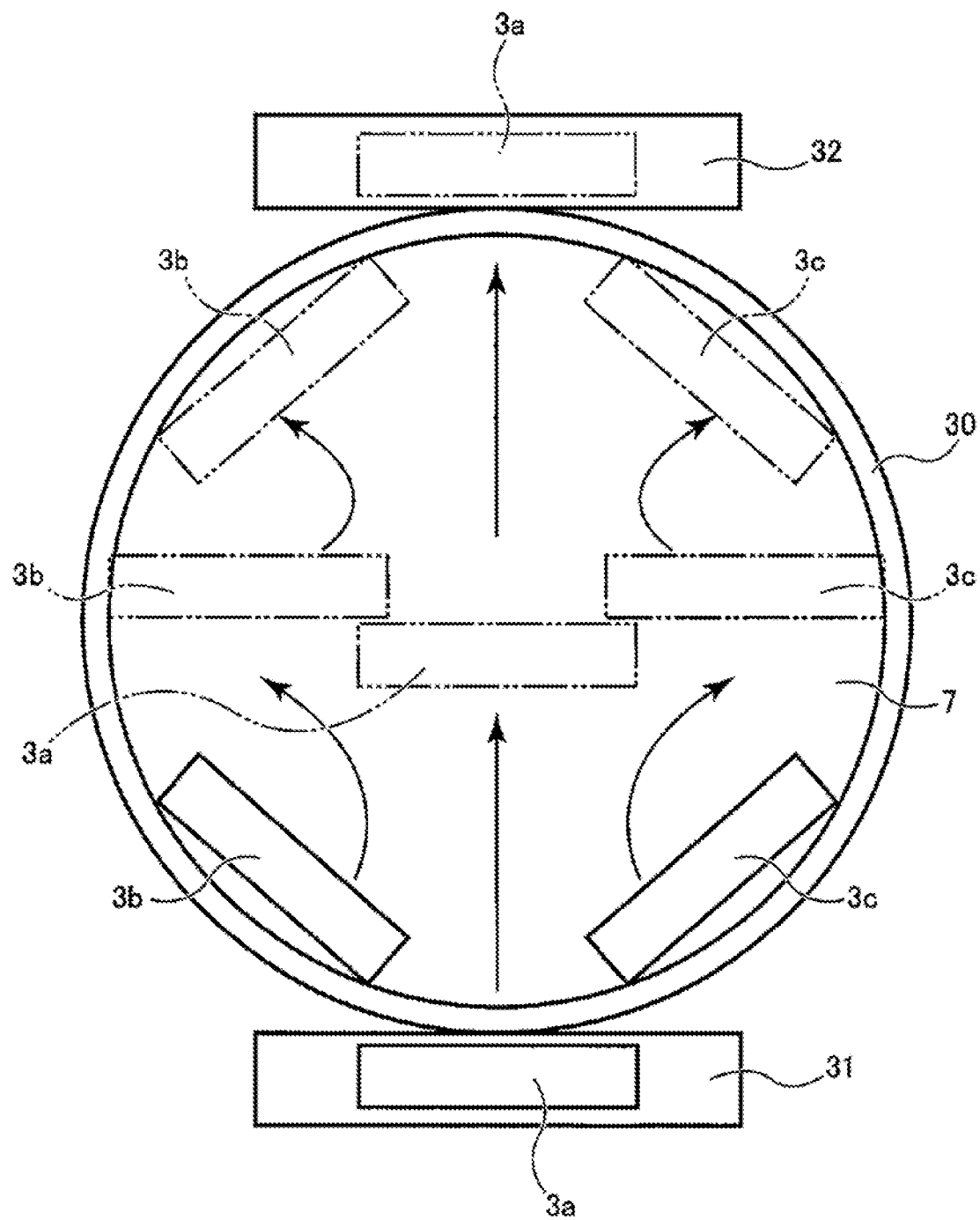
FIG. 12 is a top plan view showing the arrangement of discharge heads and stages of a fluid application device according to a third embodiment of the present invention.

FIG. 12 is a top plan view showing the arrangement of the discharge head units 1, the first stage 30 and the second stages 31, 32. As shown in FIG. 12, the solder bump forming device of this embodiment includes three discharge heads 3a to 3c. The actual solder bump forming device also includes three discharge head units 1. However, the illustration of these discharge head units 1 is omitted in FIG. 12. The illustration of the mask 8 is also omitted. In this embodiment, by focusing on a difference in moving mode of the discharge heads 3a to 3c, the discharge head 3a is also referred to as "first discharge head 3a", and the discharge heads 3b, 3c are also referred to as "second discharge heads 3b, 3c". The solder bump forming device also includes a first stage 30 for supporting the workpiece 7, and second stages 31, 32 disposed outside the first stage 30.

In this embodiment, the first stage 30 has a circular shape slightly larger than the workpiece 7 having a circular shape. However, the first stage 30 may have any shape corresponding to the shape of the workpiece 7. The second stages 31, 32 are disposed so as to oppsedly face both ends of the first stage 30 in the radial direction such that the second stages 31, 32 are in contact with an outer edge of the first stage 30. In this embodiment, the second stages 31, 32 have a rectangular shape. However, the second stages 31, 32 may have any shape which extends to the outer edge of the first stage 30. For example, the second stages 31, 32 may have a recessed shape having an arc which conforms to an arc shape of the outer edge of the first stage 30.

Figure 13:
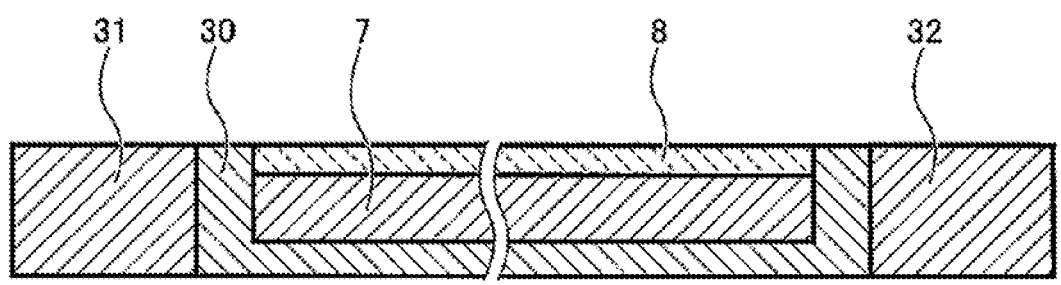
FIG. 13 is a cross-sectional view showing the arrangement of the stages.

FIG. 13 is a cross-sectional view showing the arrangement of the first stage 30 and the second stages 31, 32. As shown in FIG. 13, the first stage 30 has a recessed portion for disposing the workpiece 7 at the center of the first stage 30. The recessed portion is formed to have a size at which an upper end of the recessed portion and an upper end of the mask 8 are flush with each other when the workpiece 7 and the mask 8 are disposed in the recessed portion. Further, upper ends of the second stage 31 and 32 are disposed at the same height as the upper end of the recessed portion of the first stage 30 and the upper end of the mask 8. With such a configuration, the first discharge head 3a described later can slidingly move in the horizontal direction while being in contact with upper surfaces of the stages 30 to 32 and the mask 8.

The first discharge head 3a is configured to move in the horizontal direction above the workpiece 7. To be more specific, the first discharge head 3a moves in a straight line while passing through the center of the workpiece 7 from an initial position disposed outside the first stage 30 (a position on the second stage 31) to a final position disposed outside the first stage 30 (a position on the second stage 32).

The second discharge heads 3b, 3c are respectively disposed on both sides of the first discharge head 3a. The second discharge heads 3b, 3c move above the workpiece 7 in the same traveling direction as the first discharge head 3a while changing arrangement angles of the second discharge heads 3b, 3c.

All of widths of the discharge heads 3a to 3c in the longitudinal direction (in other words, a range in the discharge heads 3a to 3c where the fluid 9 can be discharged) are smaller than the width of the workpiece 7 (in other words, a region where the workpiece 7 is disposed). With such a configuration, the discharge heads 3a to 3c apply the fluid 9 to the whole region of the workpiece 7 in cooperation with each other. In other words, the discharge heads 3a to 3c respectively apply the fluid 9 to different regions so that the fluid 9 is applied to the whole region of the workpiece 7. The width of each of the discharge heads 3a to 3c may be ¼ or more and ½ or less of the width of the region where the workpiece 7 is disposed. With such a configuration, the fluid 9 can be uniformly applied without making the configuration of the device excessively complicated.

Figure 14:
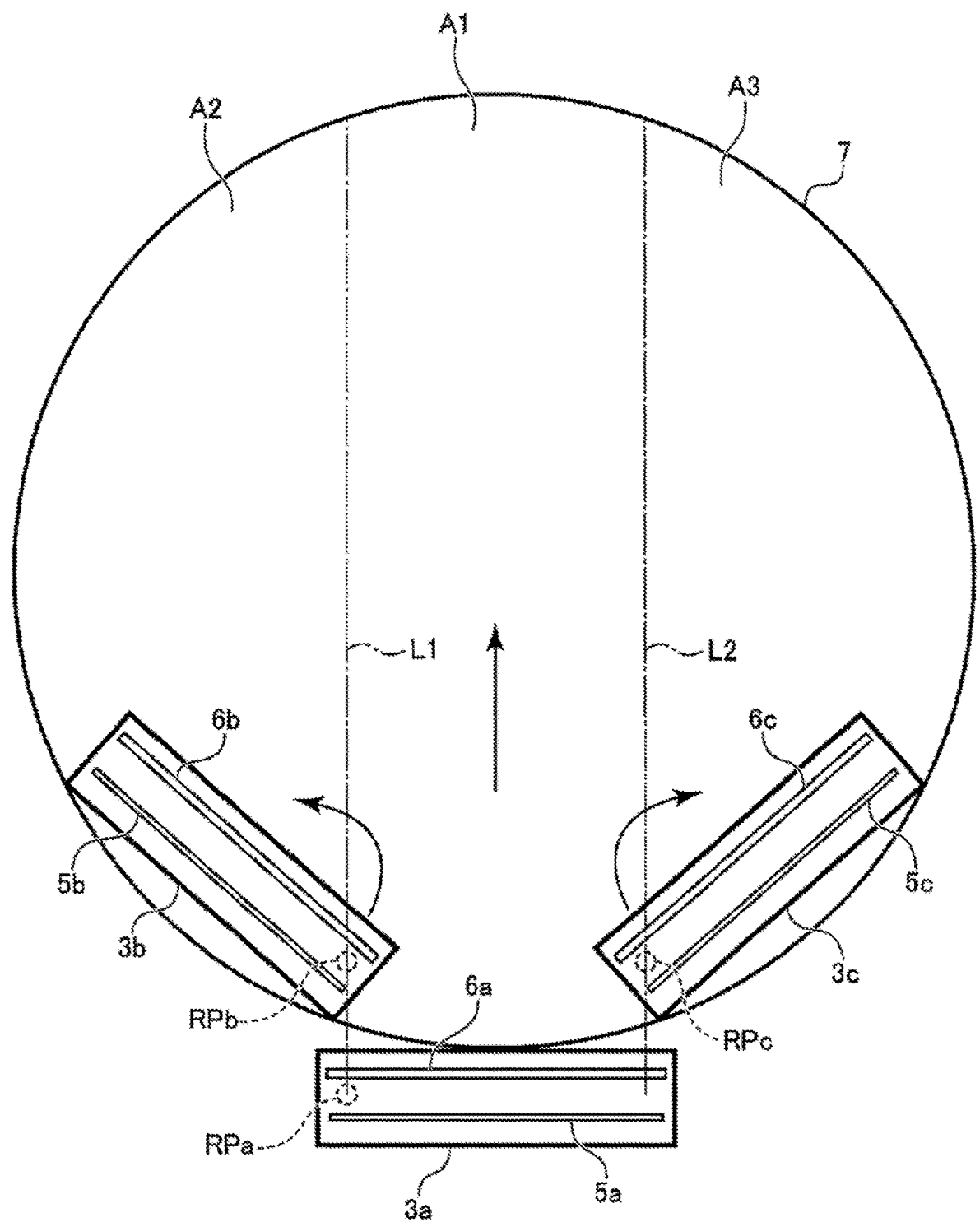
FIG. 14 is a view showing movement paths of the discharge heads.
Figure 15:
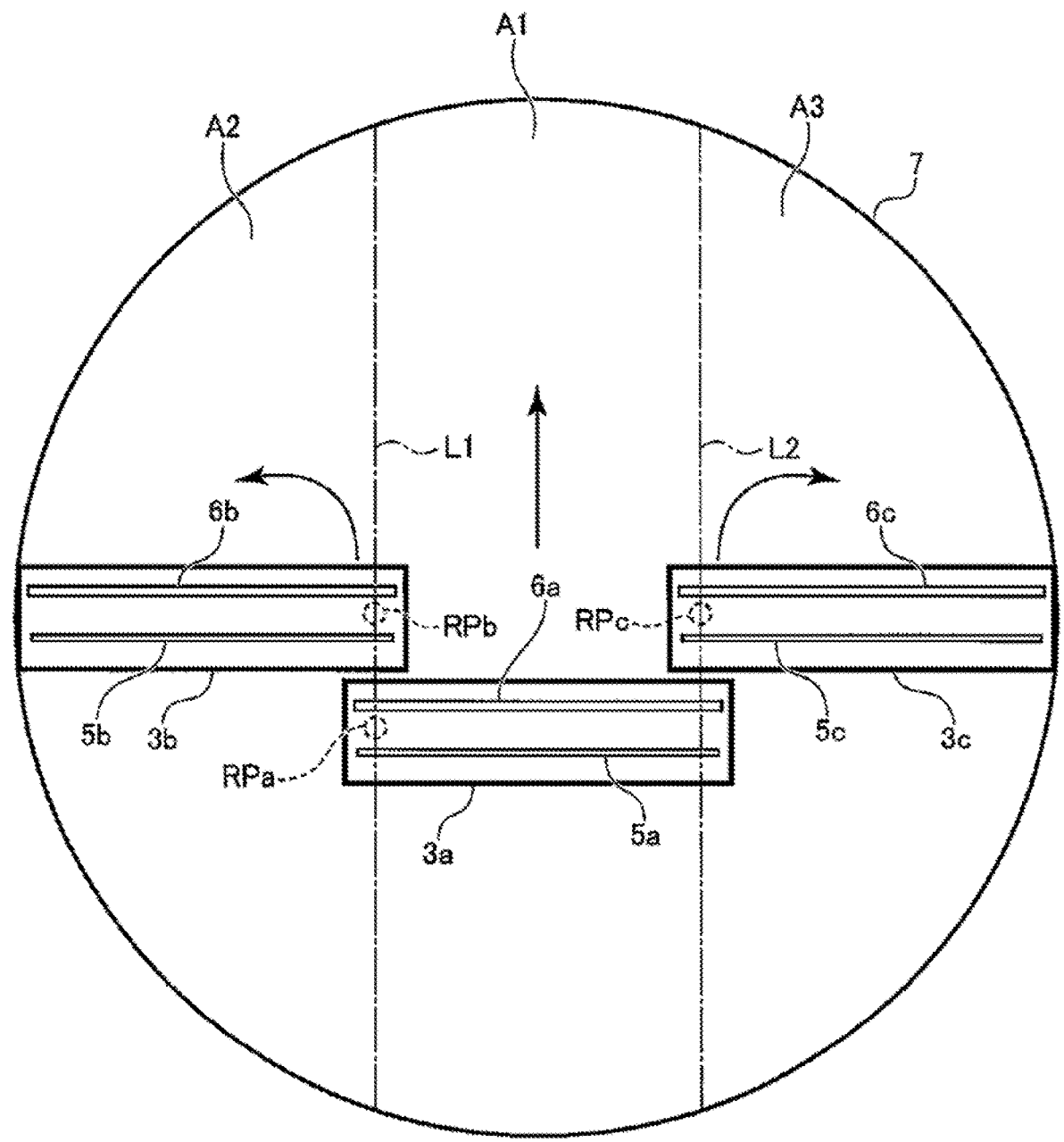
FIG. 15 is a view showing the movement paths of the discharge heads.
Figure 16:
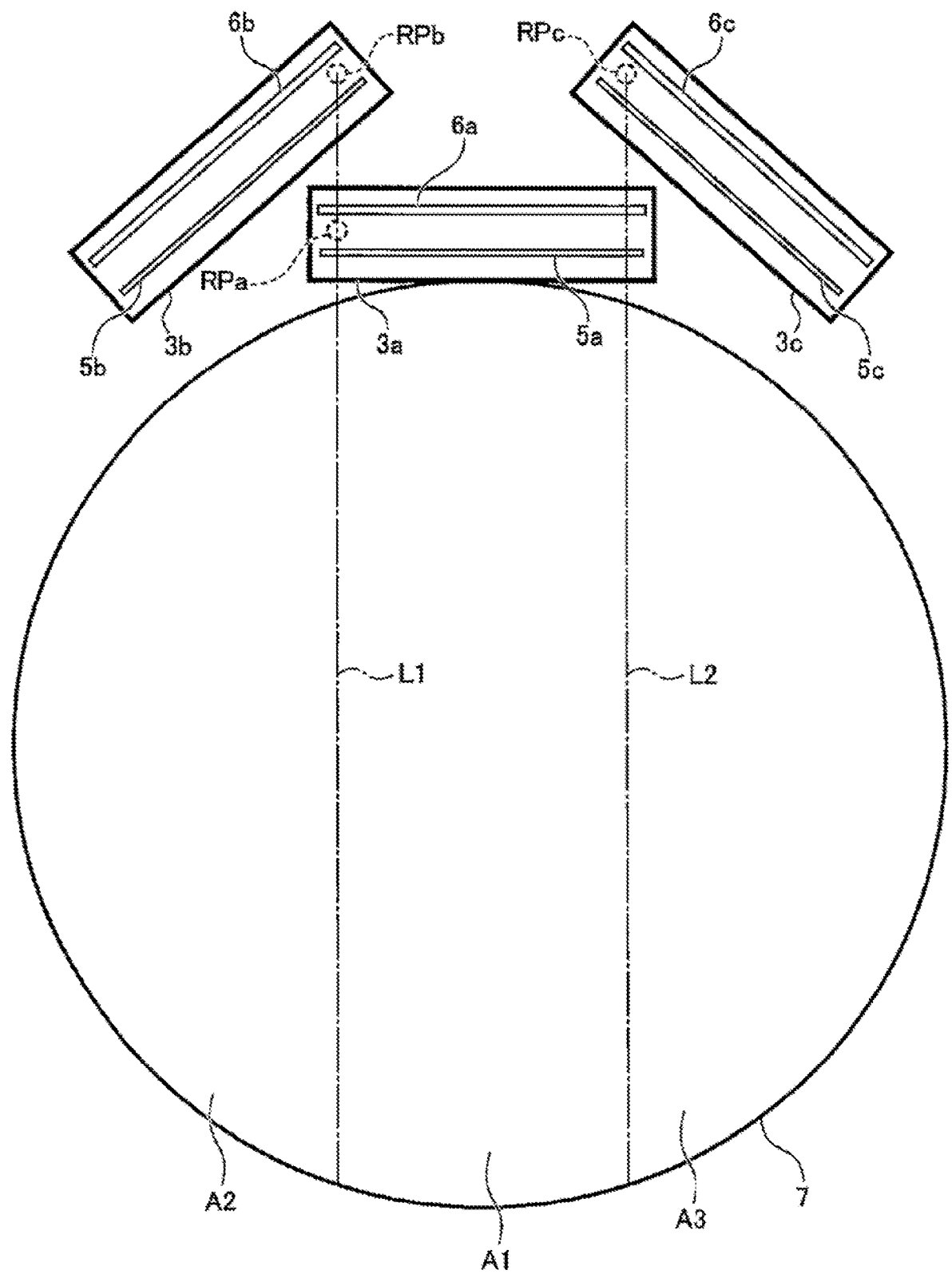
FIG. 16 is a view showing the movement paths of the discharge heads.

FIGS. 14 to 16 show specific examples of movement paths of the discharge heads 3a to 3c. FIG. 14 shows the initial position of the discharge heads 3a to 3c before scanning is performed. The first discharge head 3a is disposed on the second stage 31 (not shown in FIG. 14). The longitudinal direction of the first discharge head 3a is perpendicular to the traveling direction of the first discharge head 3a (the direction toward the upper side of the paper). The second discharge heads 3b, 3c are disposed so as to be in contact with an inner periphery of the workpiece 7 having a circular shape. In other words, the second discharge heads 3b, 3c are disposed forward of the first discharge head 3a in the traveling direction. The longitudinal directions of the second discharge heads 3b, 3c are inclined with respect to the traveling direction of the discharge heads 3a to 3c (the direction toward the upper side of the paper). Such an inclination may be set to an angle of 10 to 60 degrees with respect to the traveling direction, for example. The second discharge head 3b turns counterclockwise as the second discharge head 3b travels in the traveling direction. The second discharge head 3c turns clockwise as the second discharge head 3c travels in the traveling direction. The operation where the second discharge heads 3b, 3c travel in the traveling direction while turning can be realized by a robot arm, for example.

FIG. 15 shows the discharge heads 3a to 3c at the intermediate position during scanning. The first discharge head 3a moves in a straight line from the initial position shown in FIG. 14 to the center of the workpiece 7. A reference point RPa of the first discharge head 3a moves along a straight line L1. The second discharge heads 3b, 3c travel in the traveling direction from the initial position shown in FIG. 14 while turning so that the second discharge heads 3b, 3c are disposed at the same arrangement angle as the first discharge head 3a. That is, the longitudinal direction of the first discharge head 3a is parallel to the longitudinal directions of the second discharge heads 3b, 3c. In this turning movement, reference points RPb, RPc of the second discharge heads 3b, 3c respectively move along the straight lines L1, L2. The reference points RPb, RPc are set at end portions of the discharge nozzles 5 on the first discharge head 3a side.

FIG. 16 shows a final position of the discharge heads 3a to 3c after the scanning is finished. The first discharge head 3a moves from the intermediate position shown in FIG. 15 to the position on the second stage 32 (not shown in FIG. 16). The second discharge heads 3b, 3c travel in the traveling direction from the intermediate position shown in FIG. 15 while turning so that the second discharge heads 3b, 3c are inclined with respect to the traveling direction of the discharge heads 3a to 3c (the direction toward the upper side of the paper). The directions of the inclinations are opposite to the directions of the inclinations at the initial position. The inclinations may be set to an angle of 10 to 60 degrees with respect to the traveling direction, for example.

The discharge heads 3a to 3c move as described above so that the fluid 9 can be applied to approximately the whole region of the workpiece 7. To be more specific, the application of the fluid 9 for a center region A1 is covered by the first discharge head 3a. The application of the fluid 9 for a left region A2 is covered by the second discharge head 3b on the left side. The application of the fluid 9 for a right region A3 is covered by the second discharge head 3c on the right side. By adjusting regions where the discharge nozzles 5a to 5c of the discharge heads 3a to 3c are formed and the reference positions RP1 to RP3, it is possible to cover a region on the workpiece 7 where the fluid is to be discharged substantially without causing the overlapping.

The above-mentioned movements of the discharge heads 3a to 3c may be simultaneously performed in synchronism with each other. By performing the operation in such a manner, a processing time for the workpiece 7 can be shortened. However, after the movement of at least one of the discharge heads 3a to 3c is finished, the movement of the remaining of the discharge heads 3a to 3c may be started.

According to the above-mentioned solder bump forming device, the fluid 9 is discharged using the plurality of discharge heads 3a to 3c having a smaller size than the workpiece 7. Accordingly, even when a workpiece 7 has a large size, a pressure to be applied to the workpiece 7 from the respective discharge heads 3a to 3c is approximately uniformly distributed. Therefore, the amount of discharge of fluid 9 can be made uniform. Further, the second stages 31, 32 are disposed on the movement path of the first discharge head 3a at positions outside the first stage 30 and hence, the first discharge head 3a can apply the fluid from an outer edge to another outer edge of the workpiece 7. Further, the second discharge heads 3b, 3c move while changing arrangement angles thereof and hence, even when the application is started from a position above the workpiece 7, the fluid 9 can be discharged in a wide range. Accordingly, the fluid 9 can be discharged over a wide range region of the workpiece 7. Particularly, as in the case of this embodiment, with the use of one first discharge head 3a and two second discharge heads 3b, 3c, the fluid can be efficiently applied to approximately the whole region of the workpiece 7 having a circular shape. However, the number of discharge heads 3 may be set to any number of 2 or more according to the size or the shape of the workpiece 7.

REFERENCE SIGNS LIST

1: discharge head unit
2: fluid tank
3, 3a, 3b, 3c: discharge head
4: heater
5: discharge nozzle
6: suction port
7: workpiece
8: mask
9: fluid
10: extension pipeline
11: pressure supply means
12: suction pipe extension pipeline
13: reduced pressure supply means
14: pressure generating source
16: micro ejector
18: throttle valve
19: pressure generating source
22: fluid supply device
30: first stage
31, 32: second stage

The invention claimed is:

1. A solder bump forming device for forming a solder bump by applying molten solder into a mask on a circular silicon wafer of an electronic component, the solder bump forming device comprising:
 a head unit including a tank capable of storing the molten solder, and a discharge head, wherein
 the head unit has a longitudinal width shorter than a diameter of the silicon wafer,
 the discharge head has a discharge nozzle for discharging the molten solder, and a suction port formed in a vicinity of the discharge nozzle on both sides of the discharge nozzle and having an opening portion having a slit shape, and the suction port being configured to suction a substance in the mask on the silicon wafer,
 the discharge head is configured to move above the mask so as to discharge the molten solder from the discharge nozzle after decompressing air in an opening portion of the mask by suctioning the substance thorough the suction port, and
 a heater is provided at a lower end of the discharge nozzle, wherein the substance in the mask includes solder that has been previously discharged from the discharge nozzle, and the heater is positioned and configured to heat the previously discharged solder, which is present outside the discharge head in the mask, via the discharge head for suctioning the previously discharged solder as molten solder through the suction port.

2. A fluid discharge device for applying fluid into a mask on a circular workpiece of an electronic component, the fluid discharge device comprising:
 a plurality of head units each having a longitudinal width smaller than a diameter of the workpiece, wherein
 the plurality of head units include a first head unit configured to move in a straight line in a horizontal direction above the workpiece, and a second head unit configured to move in the horizontal direction above the workpiece in synchronism with the first head unit while turning,
 each of the first and second head units includes a tank capable of storing the fluid and provided with a first heater, and a discharge head,
 each head unit includes a discharge head that has a suction port for sucking a substance in the mask on the workpiece formed on a forward side of a traveling direction of the discharge head, and a discharge nozzle for discharging the fluid that is formed on a backward side of the traveling direction,
 a second heater is provided at a lower end of each discharge nozzle, and
 each discharge head is configured to discharge the fluid from the discharge nozzle and simultaneously perform a suction through the suction port while moving in the horizontal direction above the workpiece,
 wherein the substance in the mask includes the fluid that has been previously discharged from the discharge nozzles, and the fluid requires heating to be in a fluid state, and the second heater is positioned and configured to heat the previously discharged fluid, which is present outside the discharge head in the mask, via the discharge head for suctioning the previously discharged fluid through the suction port.

3. The fluid discharge device according to claim 2, wherein the second head unit includes two second head units disposed on both sides of the first head unit.

4. The fluid discharge device according to claim 2, wherein the suction port includes two suction ports disposed on both sides of the discharge nozzle.

5. The fluid discharge device according to claim 3, wherein the two second head units include a head unit configured to turn counterclockwise, and a head unit configured to turn clockwise.

6. A fluid discharge device for applying fluid into a mask on a circular workpiece of an electronic component, the fluid discharge device comprising:
 a stage for supporting the workpiece; and first to third discharge heads each having a discharge nozzle and being configured to discharge the fluid through the discharge nozzle while moving in a horizontal direction above the stage, wherein the first discharge head is configured to move in a straight line from an initial position located outside the stage to a final position located outside the stage through an area above the stage, the second discharge head is disposed on a left side as viewed in a traveling direction of the first discharge head, and configured to discharge the fluid while turning counterclockwise and moving in the horizontal direction above the stage, the third discharge head is disposed on a right side as viewed in the traveling direction of the first discharge head, and configured to discharge the fluid while turning clockwise and moving in the horizontal direction above the stage, a range in which the fluid can be discharged in each of the first to third discharge heads is smaller than a width of a region on the stage where the workpiece is disposed, a reference point is set in each of the second and third discharge heads at an end portions, on the first discharge head side, of the discharge nozzles formed in the second and third discharge heads, each of the reference point draws a straight line path along a movement directions of the second and third discharge heads when the second and third discharge heads move, and a heater is provided at a lower end of each discharge nozzle, and each heater is positioned and configured to heat fluid that has been previously discharged from the discharge nozzle, and which is present outside the discharge head in the mask, via the discharge head for suctioning the previously discharged fluid in a heated state through the suction port.

7. A fluid discharge device for applying fluid into a mask on a circular workpiece of an electronic component, the fluid discharge device comprising:

a stage for supporting the workpiece; and first to third discharge heads each having a discharge nozzle and being configured to discharge the fluid through the discharge nozzle while moving in a horizontal direction above the stage, wherein the first discharge head is configured to move in a straight line from an initial position located outside the stage to a final position located outside the stage through an area above the stage, the second discharge head is disposed on a left side as viewed in a traveling direction of the first discharge head, and configured to discharge the fluid while turning counterclockwise and moving in the horizontal direction above the stage, the third discharge head is disposed on a right side as viewed in the traveling direction of the first discharge head, and configured to discharge the fluid while turning clockwise and moving in the horizontal direction above the stage, a range in which the fluid can be discharged in each of the first to third discharge heads is smaller than a width of a region on the stage where the workpiece is disposed, and a heater is provided at a lower end of each discharge nozzle, and each heater is positioned and configured to heat fluid that has been previously discharged from the discharge nozzles, and which is present outside the discharge head in the mask, via the discharge head for suctioning the previously discharged fluid in a heated state through the suction port.

8. The fluid discharge device according to claim 6, wherein the first to third discharge heads are configured to move simultaneously in synchronism with each other.

9. The fluid discharge device according to claim 6, wherein the first to third discharge heads are configured to cover, in cooperation with each other, a region on the workpiece where the fluid is to be discharged substantially without causing overlapping.

10. The fluid discharge device according to claim 6, wherein the range in which the fluid can be discharged in each of the first to third discharge heads is ¼ or more and ½ or less of a width of the region on the first stage where the workpiece is disposed.

* * * * *